United States Patent

Matsuda et al.

[11] Patent Number: 5,647,034
[45] Date of Patent: Jul. 8, 1997

[54] OPERATION DISPLAYING SEMICONDUCTOR SWITCH

[75] Inventors: Ohki Matsuda; Yasunori Miyamoto, both of Kadoma, Japan

[73] Assignee: Matsushita Electric Works, Ltd., Osaka, Japan

[21] Appl. No.: 537,231

[22] Filed: Sep. 29, 1995

[30] Foreign Application Priority Data

| Oct. 3, 1994 | [JP] | Japan | 6-229274 |
| Oct. 3, 1994 | [JP] | Japan | 6-239273 |
| Jul. 14, 1995 | [JP] | Japan | 7-178928 |

[51] Int. Cl.$^6$ ............................ G02B 6/35
[52] U.S. Cl. ................. 385/16; 257/82; 385/92
[58] Field of Search ..................... 385/15, 16, 14, 385/88, 92–94; 257/80–82

[56] References Cited

U.S. PATENT DOCUMENTS

| 4,712,017 | 12/1987 | Kamasaki | 257/82 X |
| 4,933,729 | 6/1990 | Soejima et al. | 257/82 |
| 5,214,495 | 5/1993 | Kitanishi | 257/80 |
| 5,245,198 | 9/1993 | Kusuda et al. | 257/82 X |
| 5,479,288 | 12/1995 | Ishizuka et al. | 385/92 X |

FOREIGN PATENT DOCUMENTS

| 52-71184 | 6/1977 | Japan . |
| 57-106245 | 12/1982 | Japan . |
| 60-193384 | 10/1985 | Japan . |

Primary Examiner—John D. Lee
Attorney, Agent, or Firm—Burns, Doane, Swecker & Mathis, L.L.P.

[57] ABSTRACT

An operation displaying semiconductor switch includes an operation display lamp having such light emitting element as a light emitting diode and assembled in a package formed with an inner molded body of light transmitting synthetic resin and an outer molded body of non-light transmitting synthetic resin and externally enclosing the inner molded body, and light-emitting side and light-receiving side pattern conductors inner end parts of which are embedded in the inner molded body to oppose the light emitting diode and a light receiving element respectively mounted to the inner end parts of the conductors for optical coupling of both elements through the inner molded body. The operation display lamp coupled as electrically connected to the conductor is disposed partly within a lamp mounting recess of the inner molded body and is exposed at a light output surface out of the outer non-light transmitting molded body.

15 Claims, 17 Drawing Sheets

5,647,034

OPERATION DISPLAYING SEMICONDUCTOR SWITCH

BACKGROUND OF THE INVENTION

This invention relates to an operation displaying semiconductor switch having light emitting means and light receiving means incorporated in a package as mutually opposed for their optical coupling, so that the light receiving means is turned ON and OFF response to the lighting ON and OFF of the light emitting means.

DESCRIPTION OF RELATED ART

There have been suggested semiconductor switches in which such light emitting part as light emitting diode and a light receiving part employing a photodiode detecting the lighting ON and OFF of the light emitting part as combined with a proper switching element for turning ON and OFF of the switching element in response to the light ON/OFF of the light emitting part are incorporated within the package as mutually opposed. For the light receiving part, such switching element as phototriac and the like which are turned ON and OFF by the light may also be used, and the semiconductor switches of the kind referred to are provided generally in the form of solid relay, photocoupler and the like.

In the semiconductor switches of the kind referred to, there has been provided one which displays the lighting ON of the light emitting part or incorporates in the package an operation displaying lamp comprising the light emitting diode for displaying power supply state. That is, it is possible to display the lighting ON of the light emitting part with a series circuit of the light emitting part and such operation display lamp as the light emitting diode and a driving current supplied to this series circuit.

Generally, the semiconductor switch incorporating the operation displaying lamp within one package is constituted as a high brid IC comprising the general semiconductor switch and operation displaying lamp, and the package employed for the semiconductor switch of the kind referred to is formed by means of a potting.

Examples of the semiconductor switch of the kind referred to have been disclosed in Japanese Patent Laid-Open Publications Nos. 60-193384 and 52-71184 and Japanese Utility Model Laid-Open Publication No. 57-106245.

In these known semiconductor switches, however, there has been suggested none of art allowing the respective constituents to be compactly accommodated in the single package in particular and, in this respect, they still have not reached a level of sufficient satisfaction.

SUMMARY OF THE INVENTION

A primary object of the present invention is, therefore, to provide an operation displaying semiconductor switch which has eliminated the foregoing problems in the known semiconductor switches and enables it possible to be manufactured in mass scale by employing a structure which is provided with the operation displaying lamp and allows a manufacturing technique of transfer mold to be effectively utilized.

According to the present invention, the above object can be realized by means of an operation displaying semiconductor switch in which a light emitting side pattern conductors made of an electrically conducting plate are disposed on one of mutually opposing two planes, a light receiving side pattern conductors also made of an electrically conducting plate are disposed on the other plane, and a light emitting means mounted to the light emitting side pattern conductors and a light receiving means mounted to the light receiving side pattern conductors are incorporated within a package as mutually opposed to be optically coupled to each other for turning ON and OFF the light receiving means in response to lighting ON and OFF of the light emitting means, characterized in that the package is constituted by an inner molded body made of a light transmitting synthetic resin for attaining the optical coupling between the light emitting and receiving means and embedding therein the light emitting side and light receiving side pattern conductors, and by an outer molded body made of non-light transmitting synthetic resin and enclosing the inner molded body for blocking any incidence of external light onto the inner molded body, and the inner molded body has in an outer side surface a recess for mounting therein an operation displaying lamp while exposing at bottom surface of the recess a portion of the light emitting side pattern conductors on its non-mounting side of the light emitting means, the operation displaying lamp being inserted in the recess at part resin-molded and providing a visible light output to be electrically connected to the portion of the light emitting side pattern conductor exposed in the bottom of the recess while exposing the light output part to an outer side surface of the outer molded body.

With the above constitution, it is enabled to provide the operation displaying lamp within the package of such small size as an extent of the conventional semiconductor switches, to couple the light emitting means or the light receiving means to the light emitting side or light receiving side pattern conductors through a die bonding or a wire bonding, and to mold the outer molded body in a state where the operation displaying lamp is fixed in the inner molded body, so that no potting is required any more in molding the package but the package can be formed through the transfer mold, and consequently a high mass producibility can be obtained.

Other objects and advantages of the present invention shall become clear as the following description advances with reference to respective embodiments shown in accompanying drawings.

Figure 1:
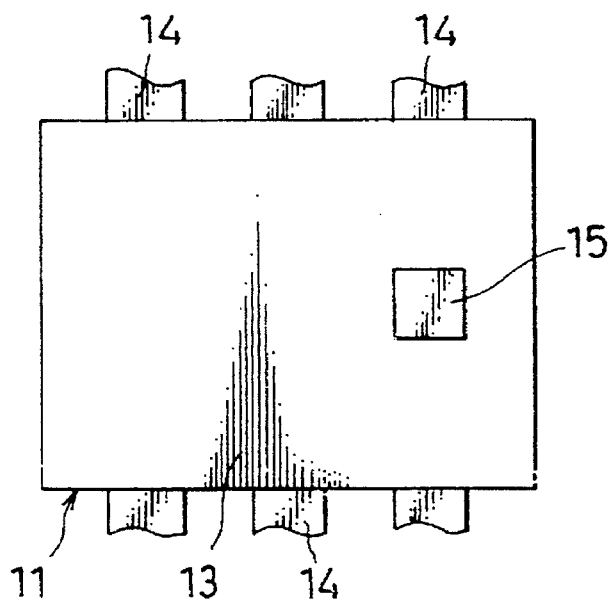
FIG. 1 shows in a plan view Embodiment 1 of the operation displaying semiconductor switch according to the present invention.

While the present invention shall now be described in the followings with reference to the respective embodiments shown in the drawings, it should be appreciated that the intention is not to limit the present invention only to these embodiments shown but rather to include all alterations, modifications and equivalent arrangements possible within the scope of appended claims.

DETAILED DESCRIPTION OF THE PREFERRED EMBODIMENTS

Embodiment 1

Figure 2:
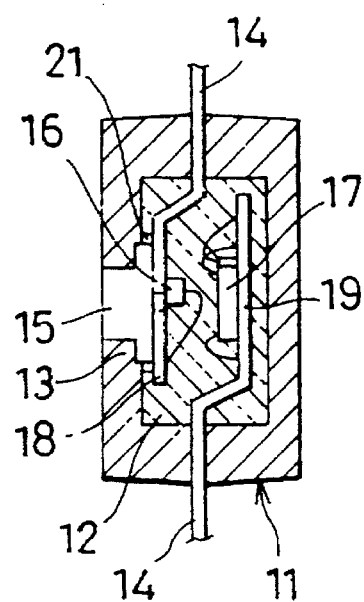
FIG. 2 is a vertically sectioned view of the semiconductor switch shown in FIG. 1.

This Embodiment 1 has such structure as shown in FIGS. 1 and 2, in which a package 11 is formed in a double structure of an inner molded body 12 made of a light transmitting synthetic resin and an outer molded body 13 made of non-light transmitting synthetic resin. Two sets of three lead strips 14 are projected out of both opposite side surfaces of the package 11, and an operation displaying lamp 15 is disposed in the package 11 at a position deviated from the center to one major surface, with a light output surface of the lamp 15 exposed to the one major surface of the package 11.

Figure 3:
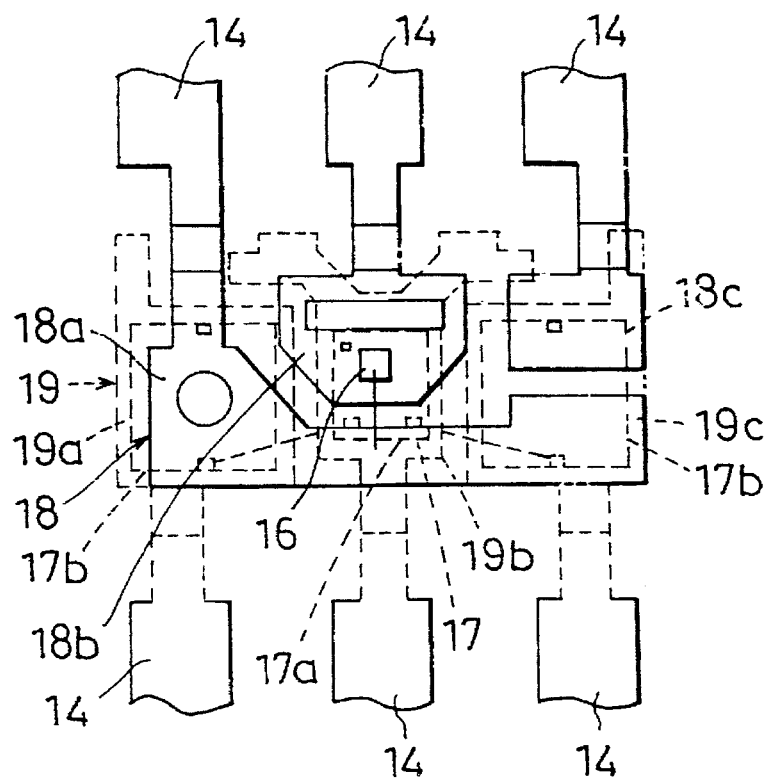
FIG. 3 shows in a plan view the light emitting side and light receiving side pattern conductors in the semiconductor switch of FIG. 1 in a state before being resin-molded.
Figure 4:
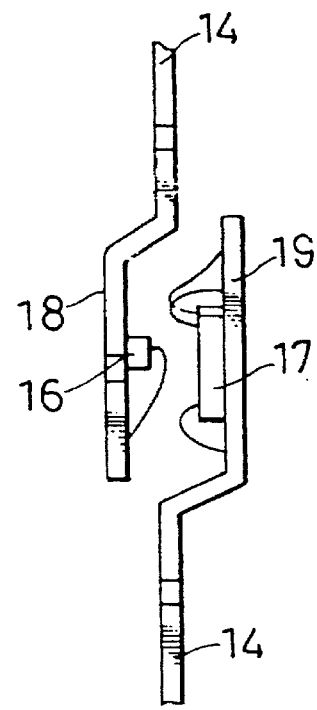
FIG. 4 shows in a side view the pattern conductors of the switch as shown in FIG. 3, before being resin-molded.

Referring also to FIGS. 3 and 4, there are sealed within the inner molded body 12 a light emitting element 16 comprising a light emitting diode as a light emitting means, and a light receiving assembly 17 comprising a photodiode array 17a and two MOSFETs 17b as a light receiving means. These light emitting element and light receiving assembly 17 are mounted respectively to each set of light emitting side pattern conductors 18 and light receiving side pattern conductors 19 formed by an electrically conducting plate with respect to a lead frame. These sets of the conductors 18 and 19 are respectively formed on each of two opposing parallel planes, and the three lead strips 14 are extended from each set of the conductors 18 and 19 in opposite directions. In the plan view of FIG. 3, the light emitting side pattern conductors 18 are shown by solid lines while the light receiving side pattern conductors 19 are denoted by broken lines for clarity.

Figure 5:
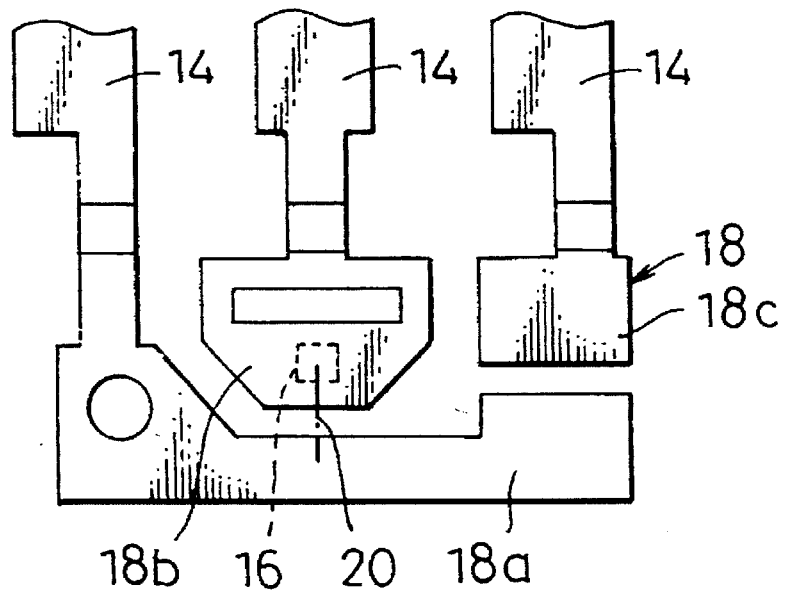
FIG. 5 is a plan view of the light emitting side pattern conductors in the semiconductor switch of FIG. 1.
Figure 6:
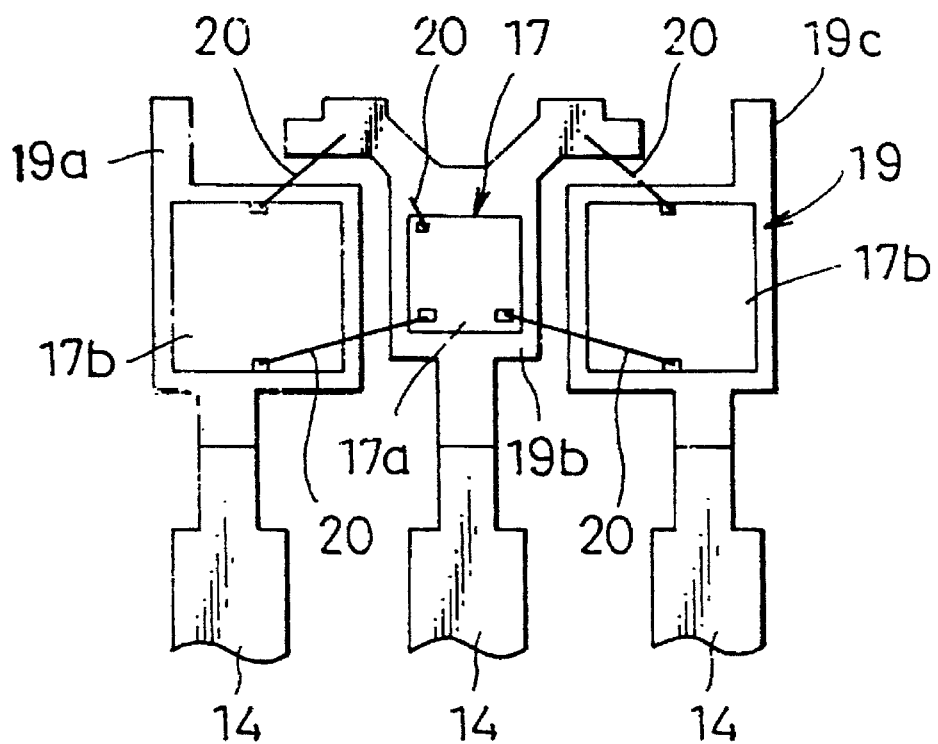
FIG. 6 is a plan view showing the light receiving side pattern conductors in the semiconductor switch of FIG. 1.

Referring further to FIGS. 5 and 6, the light emitting side pattern conductors 18 include, as shown in FIG. 5, a common pattern 18a from which a left end one of the lead strips 14 is extended, a light-emitting-means pattern 18b from which a central one of the lead strips 14 is extended, and a displaying-lamp pattern 18c from which a right end one of the lead strips 14 is extended, and the common pattern 18a has a right end part extended to a position adjacent to the displaying-lamp pattern 18c. To the light-emitting-means pattern 18b, the light emitting element 16 comprising a lightg emitting diode chip is mounted, and the element 16 is electrically connected at one end (normally at cathode) to the light-emitting-means pattern 18b and at the other end to the common pattern 18a through a bonding wire (of gold or aluminum) 20.

On the other hand, the light receiving side pattern conductors 19 include, as shown in FIG. 6, a pair of output patterns 19a and 19c from which left end and right end ones of the lead strips 14 are extended, and a light-receiving-means pattern 19b from which a central one of the load strips 14 is extended. The output patterns 19a and 19c carry respectively each of MOSFETs 17b, and these patterns 19 and 19c are electrically connected at their drains to each other and at their gates to the light-receiving-means pattern 19b through further bonding wires 20. To the light-receiving-means pattern 19b, the photodiode array 17a is mounted to the light-receiving-means pattern 19b, and the photodiode array 17a is connected at one end to the gates of the MOSFETs 17b and at the other end to the sources of the MOSFETs 17b through further bonding wires 20. With this arrangement, a series circuit in which the two MOSFETs 17b are connected at the drain and source in inverse series is eventually connected at both ends to the right and left end ones of the lead strips 14.

Thus the light emitting side pattern conductors 18 and light receiving side pattern conductors 19 are disposed to oppose each other and, in this state, the photodiode array 17a of the light receiving assembly 17 is disposed to oppose the light emitting element 16 as seen in FIG. 4. Accordingly, ON and OFF states are attained across the right and left end lead strips 14 extended from the light receiving side pattern conductors 19 as seen in FIG. 3, in response to the lighting ON and OFF of the light emitting element 16.

Figure 7:
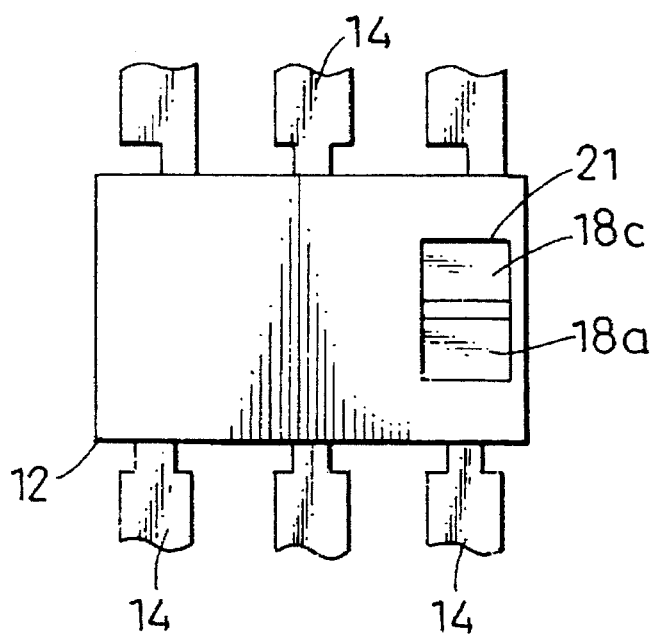
FIG. 7 shows in a plan view a state in which the inner molded body of the semiconductor switch of FIG. 1 is formed.
Figure 8:
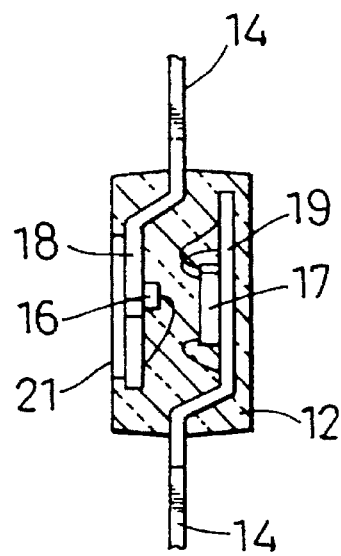
FIG. 8 is a vertically sectioned view of the switch of FIG. 1 in a state where the inner molded body is formed.

The light emitting side pattern conductors 18 and light receiving side pattern conductors 19 thus arranged are sealed within the inner molded body 12 of the light transmitting synthetic resin as shown in FIGS. 7 and 8. While the resin of the inner molded body 12 is filled also between the light emitting element 16 and the light receiving assembly 17, the resin has the light transmitting property and the light receiving assembly 17 is optically coupled in the mutually opposed state. In the inner molded body 12 as will be appreciated, further, there is provided a recess 21 for mounting the operation displaying lamp 15 at a position lying across the common pattern 18a and displaying-lamp pattern 18c, so that these patterns 18a and 18c are partly exposed at the bottom of the recess 21.

Figure 9:
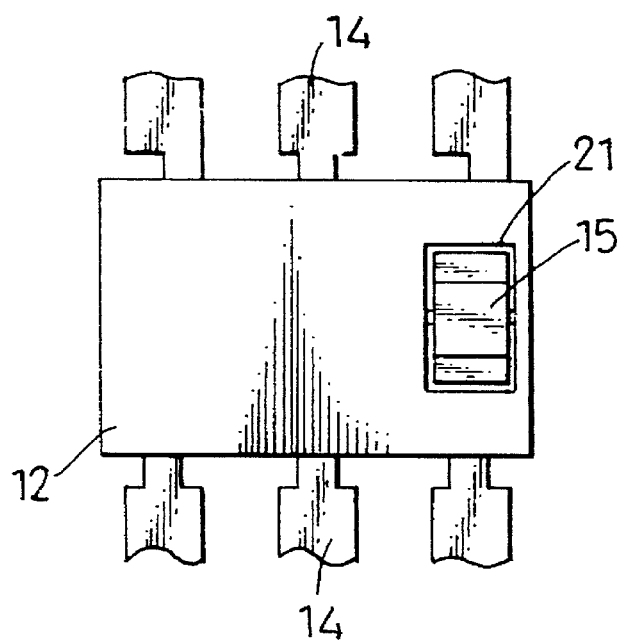
FIG. 9 is a plan view of the semiconductor switch of FIG. 1 in a state where the outer molded body is not formed yet.
Figure 10:
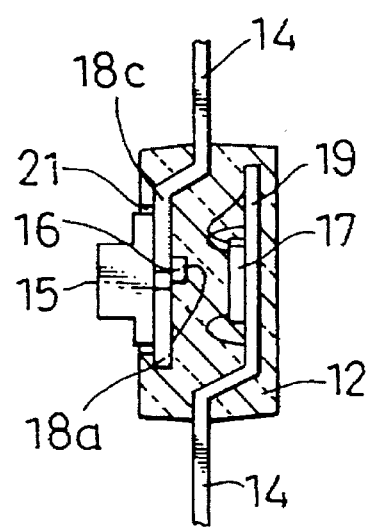
FIG. 10 is a vertically sectioned biew of the semiconductor switch in the state of FIG. 9 before formation of the outer molded body.

In the recess 21, as shown in FIGS. 9 and 10, the operation displaying lamp 15 comprising a visible light emitting diode is partly inserted. The lamp 15 has electrodes at its surface opposing the exposed patterns 18a and 18c, so that the lamp 15 can be electrically connected to the patterns 18a and 18c when the lamp 15 is partly inserted in the recess 21. Here, a solder, an electrically conducting adhesive such as a silver paste or the like may be employed for the electrical connection. Further, it is preferable that the exposed portions of the light emitting side pattern conductors 18 are heated prior to the electrical connection and are subjected to the soldering or silver plating for avoiding any faulty connection due to oxidation. When an electric power is supplied across the right and left end lead strips 14 extended from the light emitting side pattern conductors 18 in this arrangement, the operation displaying lamp 15 is lighted ON. This operation displaying lamp 15 is formed to have a stepped part so that a projecting part out of the recess 21 can be reduced in the width, while the light output surface is provided in a substantially square shape.

Since the inner molded body 12 is formed with the light transmitting synthetic resin as has been referred to, the inner molded body 12 is sealed within the outer molded body 13 of the non-light transmitting synthetic resin, in order to avoid any influence of disturbing light. At this time, the outer molded body 13 is so formed that the light output surface of the operation displaying lamp 15 is flush with corresponding outer side surface of the outer molded body 13. Further, the stepped part of the operation displaying lamp 15 is held by the outer molded body 13 and a molding pressure for molding the outer molded body 13 is made to act thereon, so that the electrodes of the operation displaying lamp 15 are urged intimately against the light emitting side pattern conductors 18, and the lamp 15 is eventually fixed within the package 11. Here, it is preferable that molding dice are provided with such measure as follows, for preventing any application of stress to the operation displaying lamp 15 due to any dimensional fluctuation so as not to damage the lamp 15. That is, the dice are formed to be provided with an injection pin part made to resiliently project and retract by a spring means with respect to the exposed part of the lamp 15, or with a shock absorber part having an elasticity such as a silicon resin on reverse side of the light emitting side pattern conductors 18 at the position where the lamp 15 is mounted.

As has been described, the package 11 can be formed through the transfer molding, by leaving part of the light emitting side pattern conductors 19 as exposed in the displaying-lamp mounting recess 21 upon molding the inner molded body 12, and mold-forming the outer molded body 13 after the mounting of the lamp 15 to the exposed part of the pattern conductors 18. Further, the operation displaying lamp 15 is directly mounted to the light emitting side pattern conductors 18 to which the light emitting element 16 is mounted, and is enabled to be minimized in size in contrast to the high brid IC which has been formed by means of the well known potting process. In addition, the operation displaying lamp 15 is disposed at a position deviated from the center of the major surface of the package 11, so that the lamp 15 makes it possible to utilize the same as a mark for instructing the direction of the package 11.

Further, when a resistor is mounted in place of the operation displaying lamp 15, it becomes possible to drive the switch with a voltage input without any additional member, by connecting the resistor in series to the light emitting element.

Embodiment 2

Figure 11:
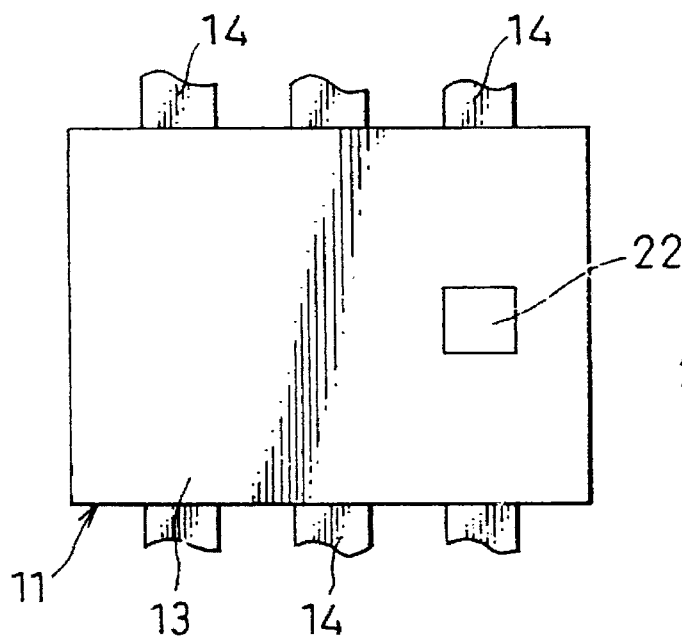
FIG. 11 shows in a plan view Embodiment 2 of the semiconductor switch according to the present invention.
Figure 12:
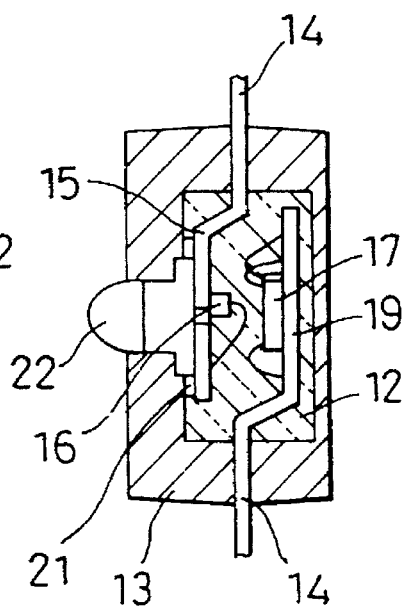
FIG. 12 is a vertically sectioned view of the switch of FIG. 11.

In the present Embodiment 2, as shown in FIGS. 11 and 12, the light output surface of the operation displaying lamp 15 is formed as retracted slightly inward from the outer surface of the outer molded body 13, without being made to be flush with the outer surface, and an optical guide 22 formed by a transparent epoxy resin is added on the retracted light output surface of the lamp 15, while a tip end of the optical guide 22 is projected out of the outer molded body 13, in the arrangement adopted here. By forming the projected tip end of the optical guide 22 out of the package 11 as a part of a spherical shape, the lighting ON or OFF state of the operation displaying lamp 15 is enabled to be visually confirmed from different directions.

With this arrangement of projecting the optical guide 22 out of the package 11, a range over which the ON/OFF state of the operation displaying lamp 15 can be visually confirmed is expanded. Other constituents and functions are the same as those in Embodiment 1. The optical guide 22 may not be required to be always transparent but may be opalescent or the like for providing the guide with the diffusibility.

Embodiment 3

Figure 13:
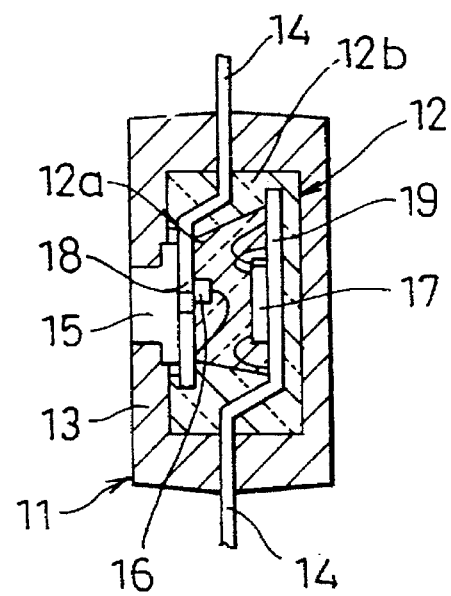
FIG. 13 shows in a vertically sectioned view Embodiment 3 of the semiconductor switch according to the present invention.

In this Embodiment 3, it is intended to further expand the range allowing the ON/OFF state of the operation displaying lamp 15 to be visually confirmed in contrast to Embodiment 2, and the package 11 is made different in the structure from Embodiment 1. That is, as shown in FIG. 13, the inner molded body 12 is made to be a double structure comprising a light leading part 12a made of the light transmitting synthetic resin (silicon resin) and a light shielding part 12b made of the non-light transmitting synthetic resin to have the displaying-lamp mounting recess 21 in the major surface, while the outer molded body 13 is formed with a transparent epoxy resin. The light leading part 12a is formed between the light emitting element 16 and the photodiode array 17a forming the light receiving assembly 17, in a shape increasing its cross sectional area in a direction from the light emitting element 16 towards the light receiving assembly 17. Further, the light shielding part 12b covers the light leading part 12a as well as the light emitting side pattern conductors 18 and light receiving side pattern conductors 19, while exposing part of the light emitting side pattern conductors 18 only at the bottom of the lamp-mounting recess 21.

While other constituents and functions are the same as those in Embodiment 1, it is optimum in the manufacture to mold the light leading part 12a by filling a space between the light emitting element 16 and the light receiving assembly 17 with the resin, thereafter to mold the light shielding part 12b, and then to mold the outer molded body 13 with the operation displaying lamp 15 mounted.

In the above structure, the outer molded body 13 formed by the transparent epoxy resin allows the whole body of the package 11 to emit the light upon lighting of the operation displaying lamp 15, and the possibility of visual confirmation of the lighted ON/OFF state of the lamp is made higher than in Embodiment 2. Further, since the inner molded body 12 is shielded from any disturbing light with respect to the light receiving assembly 17 by means of the light shielding part 12b formed with the non-light transmitting synthetic resin except for the light leading part 12a between the light emitting element 16 and the light receiving assembly 17, the switch can be prevented from causing any malfunction due to the disturbing light. Further, the transparent outer molded body 13 may be made opalescent to have the diffusibility. The outer molded body 13 may also be colored.

Embodiment 4

Figure 14:
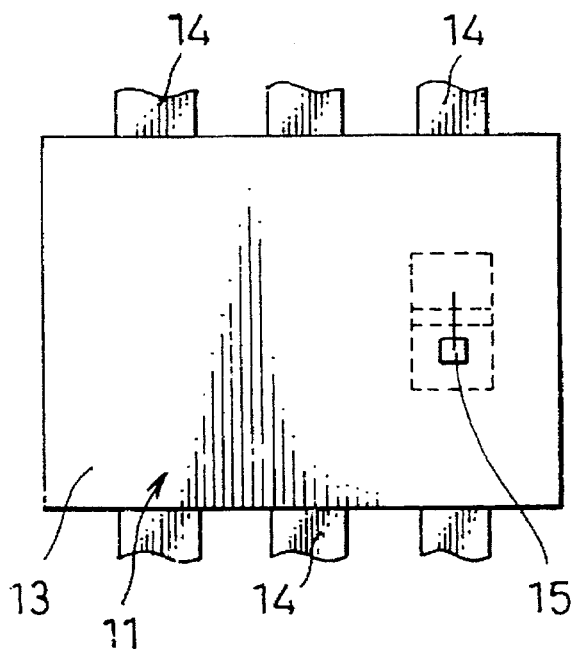
FIG. 14 is a plan view in Embodiment 4 of the semiconductor switch according to the present invention.
Figure 15:
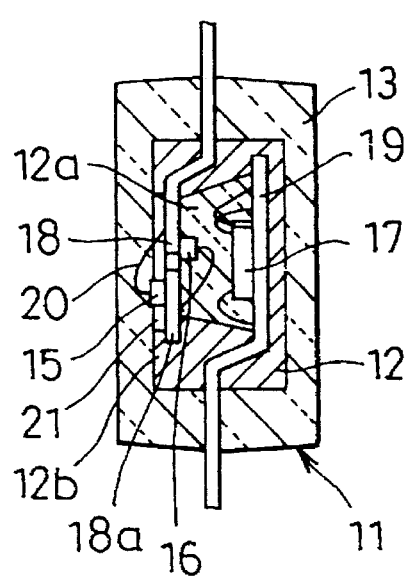
FIG. 15 is a vertically sectioned view of the switch of FIG. 14.

This Embodiment 4 adopts the structure employing the same package 11 as that in Embodiment 3 and, as shown in FIGS. 14 and 15, a bear chip is employed as the operation displaying lamp 15, in place of the resin molded member. That is, as the outer molded body 13 is formed by the transparent epoxy resin also in this Embodiment 4, it is not required to expose the light output surface of the operation displaying lamp 15 to the outer side surface of the outer molded body 13, and there can be provided a structure having the light emitting part of the operation displaying lamp 15 embedded in the outer molded body 13.

Figure 16:
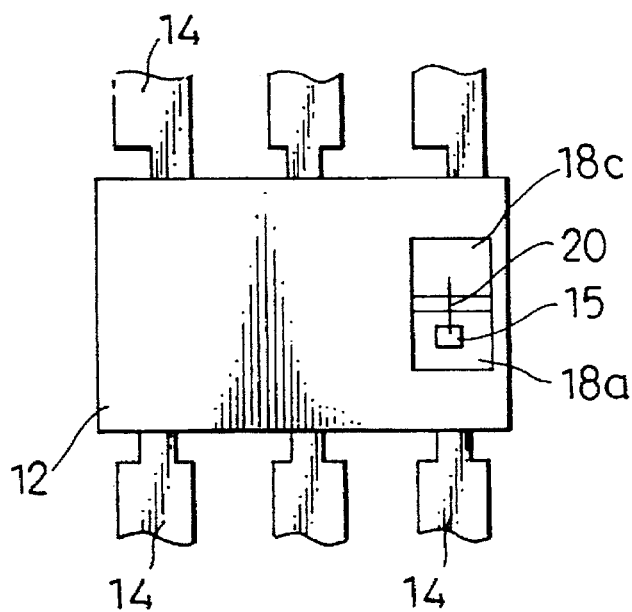
FIG. 16 is a plan view of Embodiment 3 of the semiconductor switch in a state before formation of the outer molded body in the semiconductor switch of FIG. 13.
Figure 17:
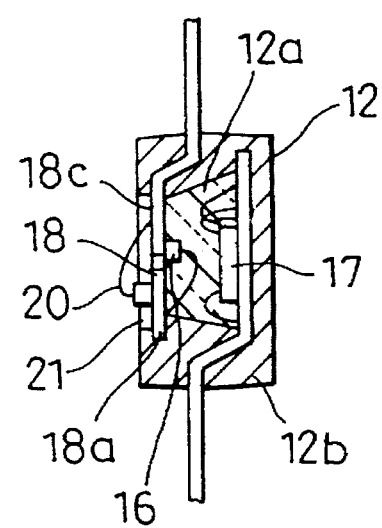
FIG. 17 is a vertically sectioned view of the switch in the state before formation of the outer molded body of FIG. 13.

In manufacturing the semiconductor switch of this Embodiment 4, as shown in FIGS. 16 and 17, the operation displaying lamp 15 comprising the bear chip of light emitting diode is mounted through the silver paste to the common pattern 18a of the light emitting side pattern conductors 18 exposed in the displaying-lamp mounting recess 21, and the operation displaying lamp 15 and displaying lamp pattern 18c are electrically connected by the bonding wires 20 of gold. Thereafter, the lamp 15, patterns 18a and 18c and wires 20 are sealed by the outer molded body 13. At this time, it is required that the exposed parts of the light emitting side pattern conductors 18 within the recess 21 are subjected to the silver plating and washing, for mounting the bear chip.

Other constituents and functions are the same as those in Embodiment 3. In this Embodiment 4, too, the outer molded body 13 made of the transparent epoxy resin improves the ability of visual confirmation of the lighted ON/OFF of the operation displaying lamp 15 and, in addition, the use of the bear chip of the light emitting diode as the operation displaying lamp 15 enables it possible to minimize the size of the switch more than in the case where the resin molded member is employed.

Embodiment 5

In this Embodiment 5, as shown in FIGS. 17 to 23, the bear chip of the light emitting diode is employed as the operation displaying lamp 15, similarly to Embodiment 4. In the present Embodiment 5, the outer molded body 13 occupies part of the package 11 corresponding to the light shielding part 12b and outer molded body 13 in Embodiment 4, and is continuously integrally formed with the non-light transmitting synthetic resin. Further, the displaying-lamp mounting recess 21 is formed to extend from the outer side surface of the outer molded body 13 to the light emitting side pattern conductors 18, and an optical guide 22 is formed with a light transmitting synthetic resin for attaining both of the protection of the lamp 15 and a function of lens.

Figure 18:
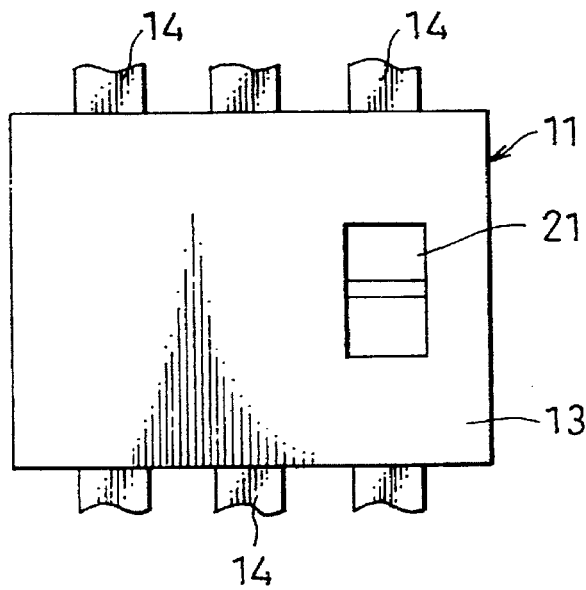
FIG. 18 is a plan view in a state where the outer molded body is formed in Embodiment 5 of the semiconductor switch according to the present invention.
Figure 19:
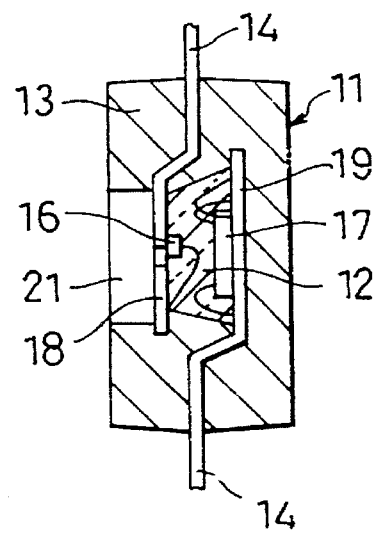
FIG. 19 is a vertically sectioned view in a state where the outer molded body is formed in the semiconductor switch of FIG. 18.
Figure 20:
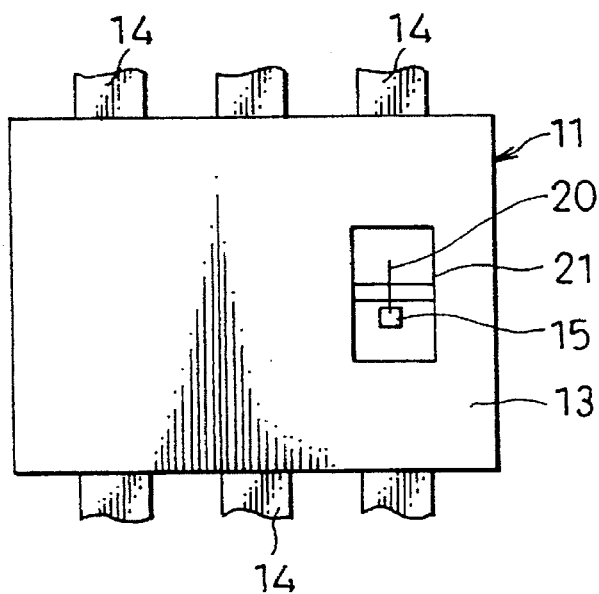
FIG. 20 is a plan view in a state where the operation displaying lamp is mounted to the semiconductor switch of FIG. 18.
Figure 21:
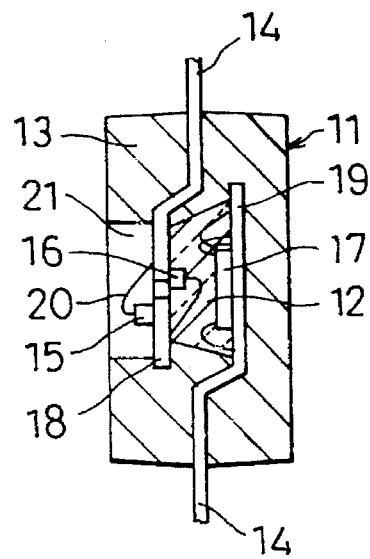
FIG. 21 is a vertically sectioned view in the state where the operation displaying lamp is mounted to the switch of FIG. 18.
Figure 22:
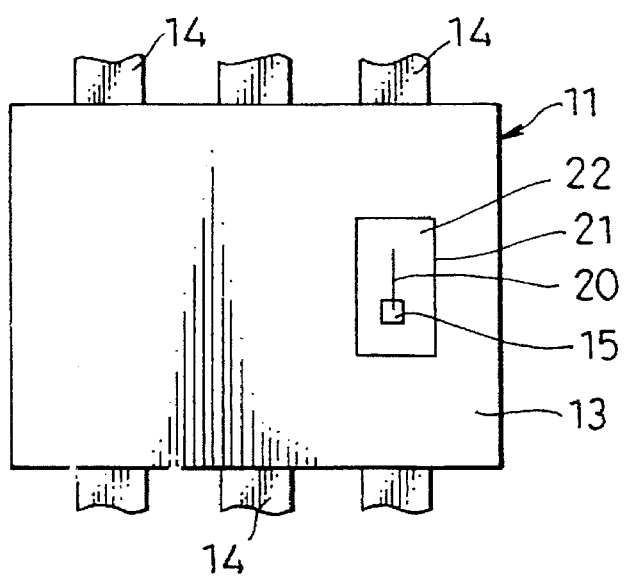
FIG. 22 is a plan view of the semiconductor switch of FIG. 18.
Figure 23:
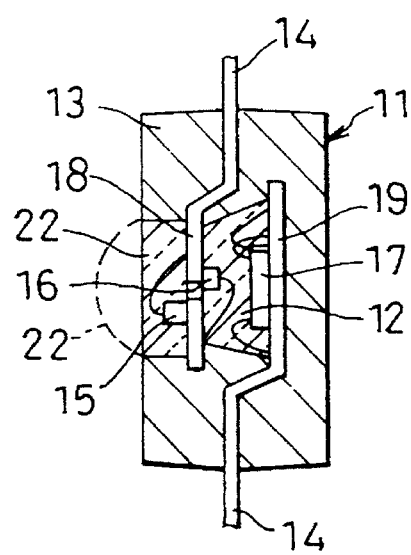
FIG. 23 is a vertically sectioned view of the semiconductor switch of FIG. 18.

In manufacturing the semiconductor switch of the present Embodiment 5, as shown in FIGS. 18 and 19, the inner molded body 12 of the light transmitting synthetic resin and corresponding to the light leading part 12a in Embodiment 4 is formed by filling the resin between the light emitting element 16 mounted to the light emitting side pattern conductors 18 and the light receiving assembly 17 mounted to the light receiving side pattern conductors 19, and the light emitting element 16 and light receiving assembly 17 are optically coupled. Next, the outer molded body 13 is formed with the non-light transmitting synthetic resin. Here, the outer molded body 13 is formed to leave the recess 21 for mounting the displaying lamp. Next, as shown in FIGS. 20 and 21, the bear chip of the light emitting diode and forming the operation displaying lamp 15 is mounted to the common pattern 18a of the light emitting side pattern conductors 18 and is electrically connected through the bonding wire 20 to the displaying-lamp pattern 18c. Further, as shown in FIGS. 22 and 23, the optical guide 22 is formed through the potting, the operation displaying lamp 15 is thereby protected, and the visual confirmation ability can be improved by this optical guide 22. While this optical guide 22 may be formed to be flush with the outer side surface of the outer molded body 13, the visual confirmation ability of the lighting ON/OFF of the lamp 15 can be further improved by projecting part of the optical guide 22 out of the outer side surface of the body 13 as shown by dotted line in FIG. 23, and forming thus projected part of the guide as part of the spherical shape.

With the above arrangement, the operation displaying lamp 15 can be incorporated in the common package 11 to the light emitting element 16 and light receiving assembly 17 so that the mounting work of the lamp 15 is made easier than in the case where the lamp 15 is separately provided, and, in addition, the shape of the optical guide 22 can be optionally designed so that the arrangement can be adapted to a visual confirmation from a specific direction only or from various directions, as occasion demands. Other constituents and functions are the same as those in Embodiment 4.

Embodiment 6

Figure 24:
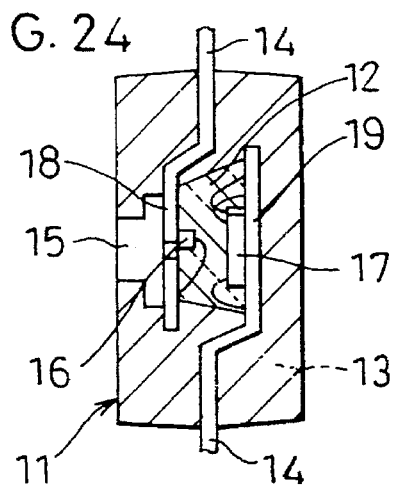
FIG. 24 is a vertically sectioned view of Embodiment 6 of the semiconductor switch according to the present invention.

In this Embodiment 6, the package 11 is formed into the double structure of the inner molded body 12 and outer molded body 13 as shown in FIG. 24, while the inner molded body 12 is formed with the light transmitting synthetic resin to include only in part a portion corresponding to the light leading part 12a in Embodiment 3 and a portion corresponding to the light shielding part 12b is omitted. The outer molded body 13 is formed with the non-light transmitting synthetic resin to have a structure including a portion corresponding to the light shielding part 12b in Embodiment 3, that is, to be the same structure as the package 11 in Embodiment 5.

Figure 25:
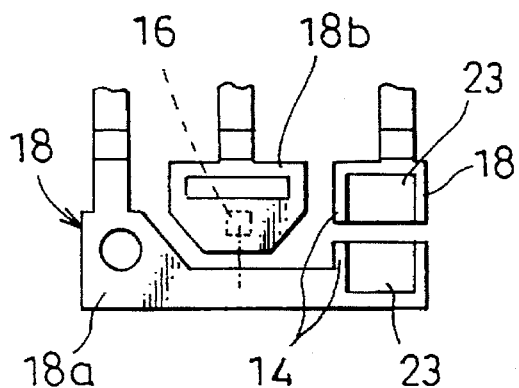
FIG. 25 is a plan view of the light emitting side pattern conductors before mounting the operation displaying lamp in the semiconductor switch of FIG. 24.
Figure 26:
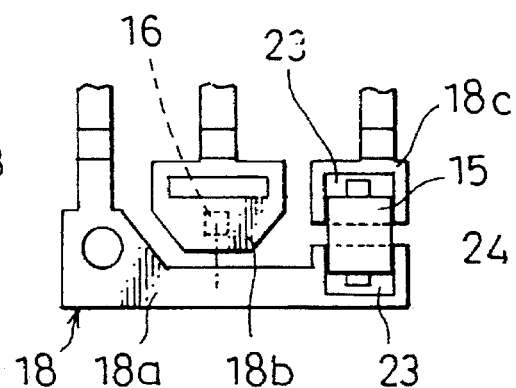
FIG. 26 is a plan view of the light emitting side pattern conductors after mounting of the operation displaying lamp in the semiconductor switch of FIG. 24.
Figure 27:
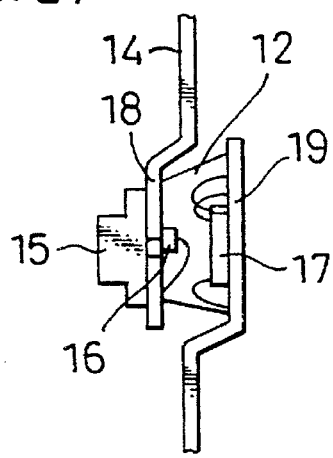
FIG. 27 is a side elevation of the light emitting and receiving side pattern conductors in the state of before formation of the outer molded body in the semiconductor switch of FIG. 24.

Since in the package 11 of this structure the inner molded body 12 cannot be provided with the recess 21 for mounting the operation displaying lamp 15 formed with a resin molded, there are formed in the light emitting side pattern conductors 18 positioning recesses 23 for positioning the lamp 15. In this case, pads 24 are formed on mutually adjacent portions of the common pattern 18a and display-lamp mounting pattern 18c, and the positioning recesses 23 of such shape as seen in FIG. 25 are formed on the pads 24. Thereafter, the operation displaying lamp 15 comprising the resin-molded light emitting diode is positioned on the patterns by means of the positioning recesses 23 as shown in FIG. 26 and is connected to the pads 24 with such electrically conducting adhesive as the solder or silver paste employed. In this state, as shown in FIG. 27, the inner molded body 12 is interposed as the light leading part between the light emitting side pattern conductors 18 and the light receiving side pattern conductors 19, and the operation displaying lamp 15 is fixed to the light emitting side pattern conductors 18. Then, the outer molded body 13 is formed as shown in FIG. 24. Since this outer molded body 13 is non-light transmitting, the light output surface of the lamp 15 is exposed from the package 11 with the light output surface made flush with the outer side surface of the outer molded body 13.

Figure 28:
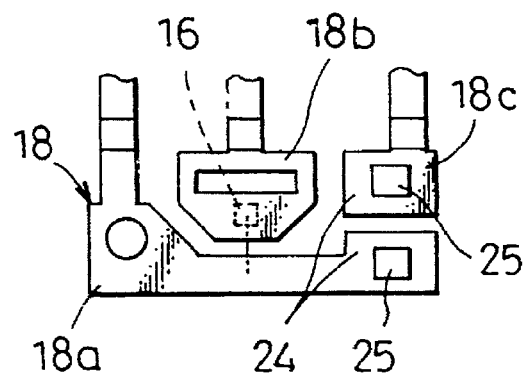
FIG. 28 is a plan view of the light emitting side pattern conductors in another aspect and before mounting the operation displaying lamp in the semiconductor switch of FIG. 24.
Figure 29:
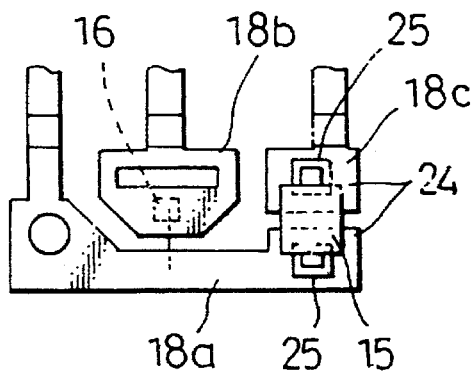
FIG. 29 is a plan view of the light emitting side pattern conductors of FIG. 28 and after mounting of the operation displaying lamp in the semiconductor switch of FIG. 24.

In the above arrangement, the formation of the positioning recesses 23 in the light emitting side pattern conductors 18 for the operation displaying lamp 15 during the manufacture is also contributive to a positioning of a resin molded portion of the lamp 15. Further, such positioning holes 25 provided as shown in FIGS. 28 and 29 for terminal portions of the lamp 15 will also achieve the same function. Other constituents and functions are the same as those in Embodiment 1.

Embodiment 7

Figure 30:
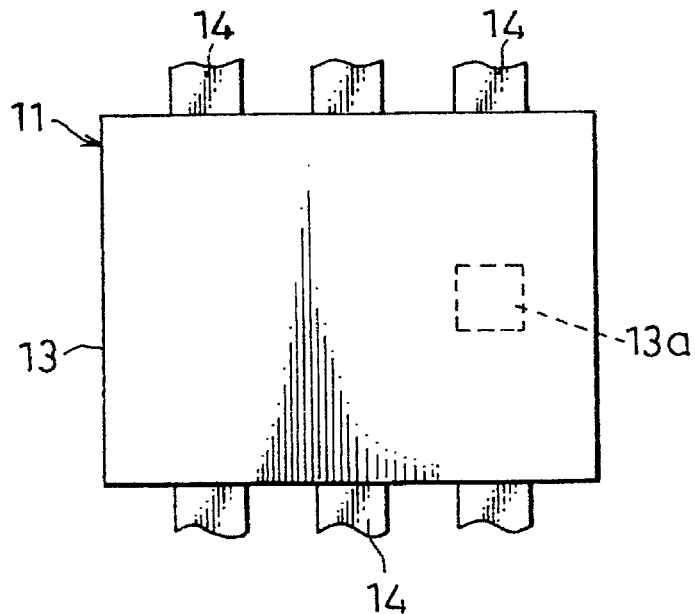
FIG. 30 is a plan view in Embodiment 7 of the semiconductor switch according to the present invention.
Figure 31:
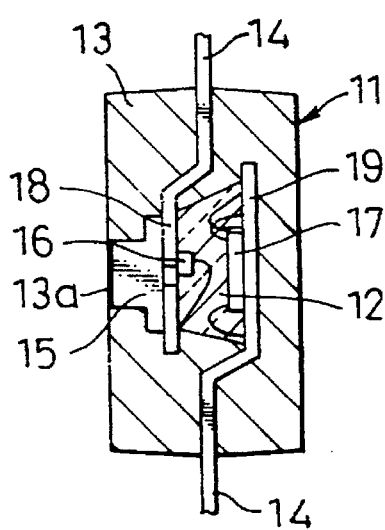
FIG. 31 is a vertically sectioned view of the semiconductor switch of FIG. 30.

In this Embodiment 7, substantially the same structure as Embodiment 6 is adopted but, as shown in FIGS. 30 and 31, the light output surface of the operation displaying lamp 15 is covered with the outer molded body 13, in contrast to Embodiment 6 in which the light output surface of the lamp 15 resin-molded is exposed on the outer surface of the outer molded body 13. In this event, a portion of the outer molded body 13 covering the light output surface of the lamp 15 is formed as a thinned part 13a of a thickness less than 100 μm.

With the covering of the light output surface of the lamp 15 by the thinned part 13a as in the above, the switch can be so constructed that the presence of the lamp 15 is almost impossible to be visually confirmed when the lamp 15 is not lighted ON but the light output is partly led out of the thinned part 13a when the lamp 15 is lighted ON. That is, while the package 11 provides the same appearances as the one having no operation displaying lamp 15, the output light of the lamp 15 once lighted ON is made to leak out through the thinned part 13a so as to allow the lighted state to be visually confirmed. Further, as the light output surface of the lamp 15 is covered by the thinned part 13a of the outer molded body 13, the lamp 15 is provided with no part exposed to the atmosphere so as to be high in such environmental resistance as the humidity resistance and so on, and required space on the outer side surface of the outer molded body 13 for describing specifications or style or model number and the like can be enlarged. Other constituents and functions are the same as those in Embodiment 6.

Embodiment 8

Figure 32:
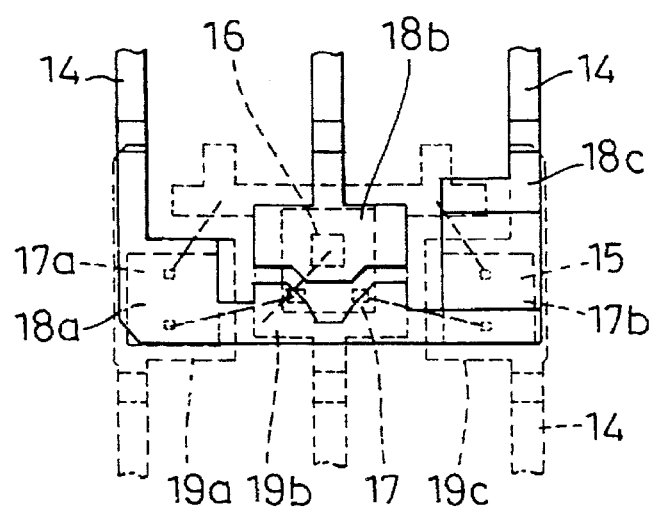
FIG. 32 is a plan view of the light emitting side and light receiving side pattern conductors in Embodiment 8 of the semiconductor switch according to the present invention, before formation of the inner molded body.
Figure 33:
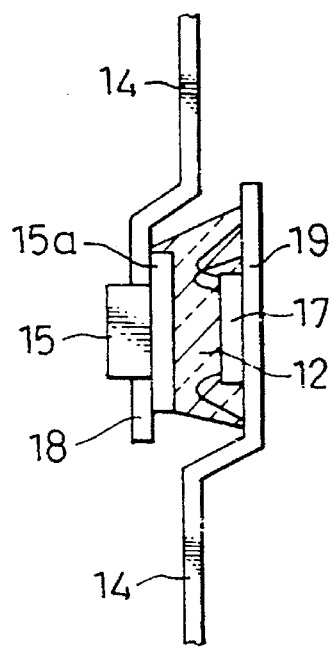
FIG. 33 is a vertically sectioned view of the pattern conductors after formation of the inner molded body in Embodiment 8 of FIG. 32.

While in the foregoing Embodiment 6 the operation displaying lamp 15 resin-molded and the light emitting element 16 are mounted respectively to the opposite side surfaces of the light emitting side pattern conductors 18, the present Embodiment 8 shows to have a flange 15a formed on the resin-mold of the lamp 15 and urged against the same side surface of the light emitting side pattern conductors 18 as the mounting side surface of the light emitting element 16, as shown in FIGS. 32 and 33. Here, the light emitting side pattern conductors 18 and light receiving side pattern conductors 19 are different in the shape from those in Embodiment 6 but are the same in the relationship of the electric connection. Further, a gap between the common pattern 18a and the displaying-lamp mounting pattern 18c in the light emitting side pattern conductors 18 is set to be of a size allowing the operation displaying lamp 15 to be passed therethrough. The electrodes of this lamp 15 are formed at portions of the flange 15a which engage the light emitting side pattern conductors 18, and are electrically and mechanically coupled to the conductors 18 by means of the silver paste or solder.

Figure 34:
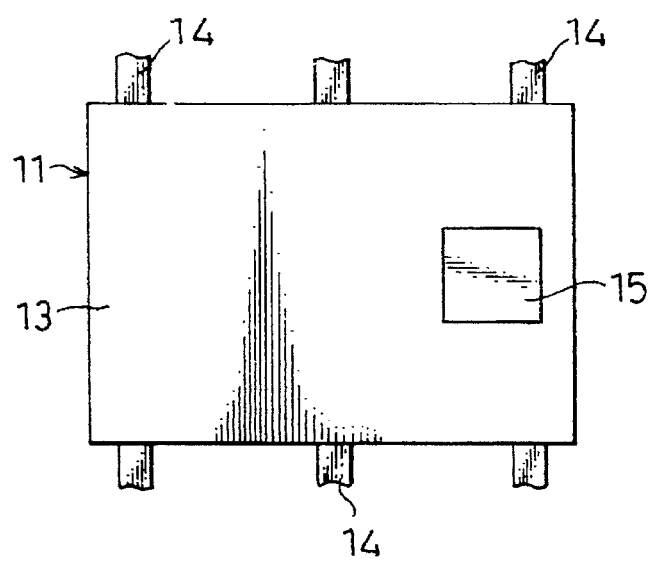
FIG. 34 is a plan view of the semiconductor switch of Embodiment 8 of FIG. 32 with the inner and outer molded cases formed and the operation displaying lamp mounted.
Figure 35:
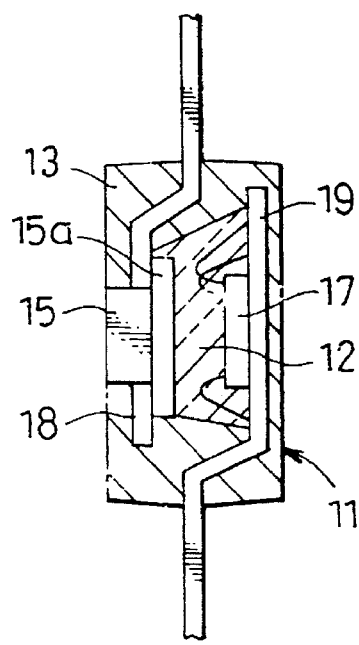
FIG. 35 is a vertically sectioned view of the semiconductor switch of FIG. 34.

In manufacturing the switch of the above embodiment 8, similarly to the respective foregoing Embodiments, the light emitting element 16 mounted to the light emitting side pattern conductors 18 and the light receiving assembly 17 mounted to the light receiving side pattern conductors 19 are optically coupled through the inner molded body 12 made of the light transmitting synthetic resin, and the operation displaying lamp 15 is mounted to the light emitting side pattern conductors 18 in such mode as referred to above. Thereafter, as shown in FIGS. 34 and 35, the outer molded body 13 of the non-light transmitting synthetic resin may be formed in the mode of exposing the light output surface of the lamp 15. Here, the light emitting element 16 and the lamp 15 are disposed as mutually separated and the outer molded body 13 of the non-light transmitting resin is interposed between the lamp 15 and the inner molded body 13, so that the output light of the lamp 15 or external light can be prevented from being received by the light receiving assembly 17, and any malfunction due to such light can be restrained.

According to the structure of the present Embodiment 8, it is possible to reduce the thickness of the package 11 in the direction of coupling the light emitting element 16 and the light receiving assembly 17, to be smaller than in the case of Embodiment 6 so long as the constituents of the same size as in Embodiment 6 are employed. That is, at contemporary technical level, it is possible to form the package 11 to be about 2 mm thick, and the switch can be of more thin type.

Embodiment 9

While in the respective foregoing Embodiments the structure in which the operation displaying lamp 15 is incorporated in the package 11 upon molding of the package 11 are provided, the present Embodiment 9 employs a structure which allows the operation displaying lamp 15 to be mounted after the mold forming of the package 11.

Figure 36:
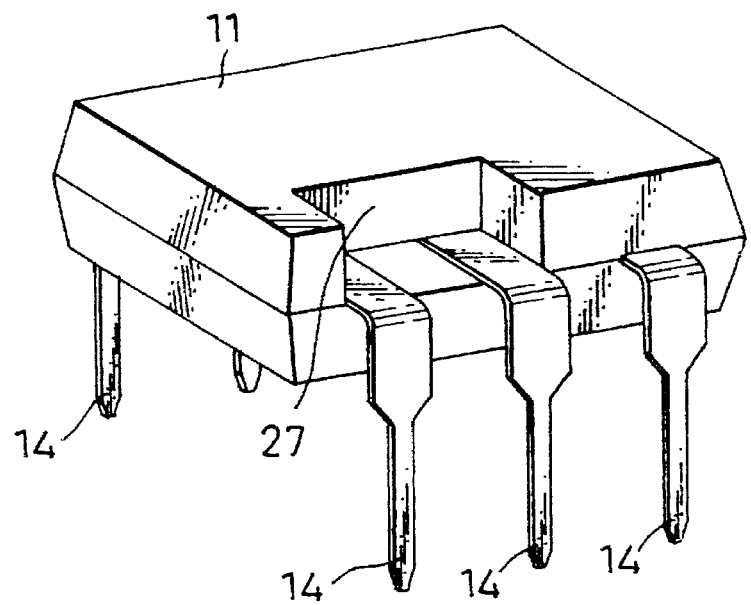
FIG. 36 is a perspective view showing the semiconductor switch in Embodiment 9 according to the present invention, before mounting the operation displaying lamp.
Figure 37:
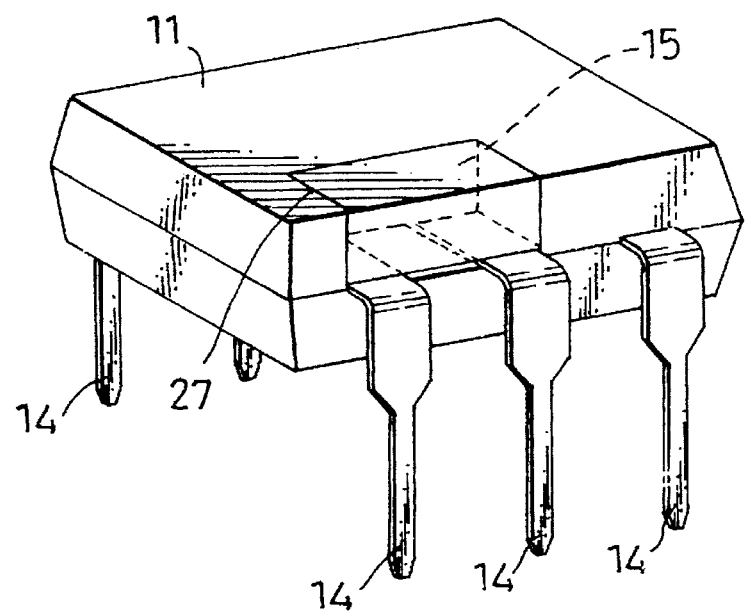
FIG. 37 is a perspective view of the semiconductor switch FIG. 36 after mounting the operation displaying lamp.
Figure 38:
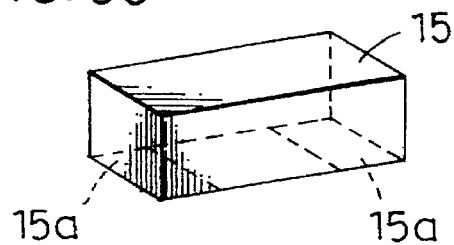
FIG. 38 is a perspective view of the operation displaying lamp employed in the switch of FIG. 37.

That is, as shown in FIG. 36, the package 11 is formed to have a notch or recess 27 at an edge portion lying across two adjacent lead strips 14 extended from the light-emitting means pattern 18b and displaying-lamp mounting pattern 18c, as a displaying-lamp mounting part for fitting therein the operation displaying lamp 15 comprising the light emitting diode chip as shown in FIG. 38. In this notch 27, the lead strips 14 are exposed, and the lamp 15 can be integrally incorporated in the package 11 by engaging the lamp 15 within the notch 27. As shown in FIG. 38, the lamp 15 is provided with the electrodes 15a at both end parts on the bottom surface as shown in FIG. 38, which electrodes 15a are connected to the lead strips 14 exposed in the notch 27 by means of such electrically conducting adhesive as the solder or silver paste upon engaging the lamp 15 into the notch 27. In order here that the lamp 15 will not be caused to escape from the package 11 due to the heat applied upon mounting the switch to the circuit board with the soldering, it is preferable that the lamp 15 is fixedly secured to the package 11 by means of such adhesive as the epoxy resin. Other constituents and their functions are the same as those in Embodiment 1.

Embodiment 10

Figure 39:
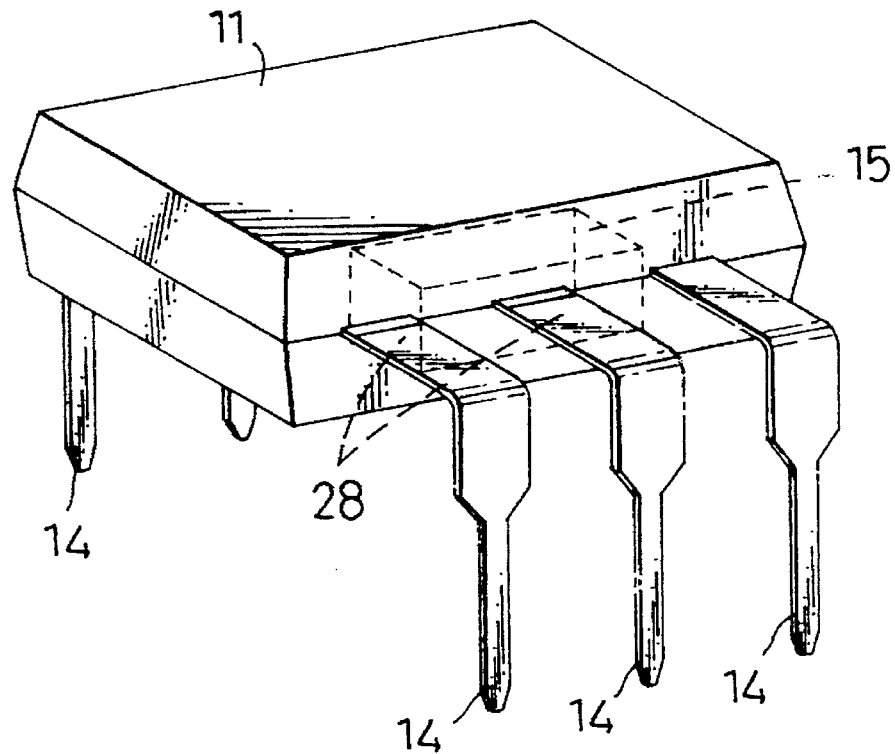
FIG. 39 is a perspective view of Embodiment 10 of the semiconductor switch according to the present invention.

While in the foregoing Embodiment 9 the package 11 having the notch 27 is employed, the present Embodiment 10 employs such package 11 as shown in FIG. 39, which is provided, instead of the notch 27, with longer extended lead strips 14 out of the package 11 than the width of the operation displaying lamp 15 of the light emitting diode chip, and with pads 28 formed on the extended parts of the lead strips 14 as a displaying lamp connector to be electrically connected to the electrodes 15a of the lamp 15. With this arrangement, the switch of the present invention can be easily realized only by modifying the size of the lead strips 14 in the known semiconductor switches. With respect to the pads 28, the electrodes 15a of the operation displaying lamp 15 are connected by means of such electrically conducting adhesive as the solder, silver paste and the like. In order to prevent the lamp 15 from disengaging from the package 11, the lamp 15 should preferably be secured to the package 11 by means of such adhesive as epoxy resin. While in this case the lamp 15 is not integrally incorporated in the package 11, it is possible to mount the lamp 15 to the package 11 simultaneously with the mounting of the semiconductor switch itself. Other constituents and their functions are the same as those in Embodiment 1.

Embodiment 11

Figure 40:
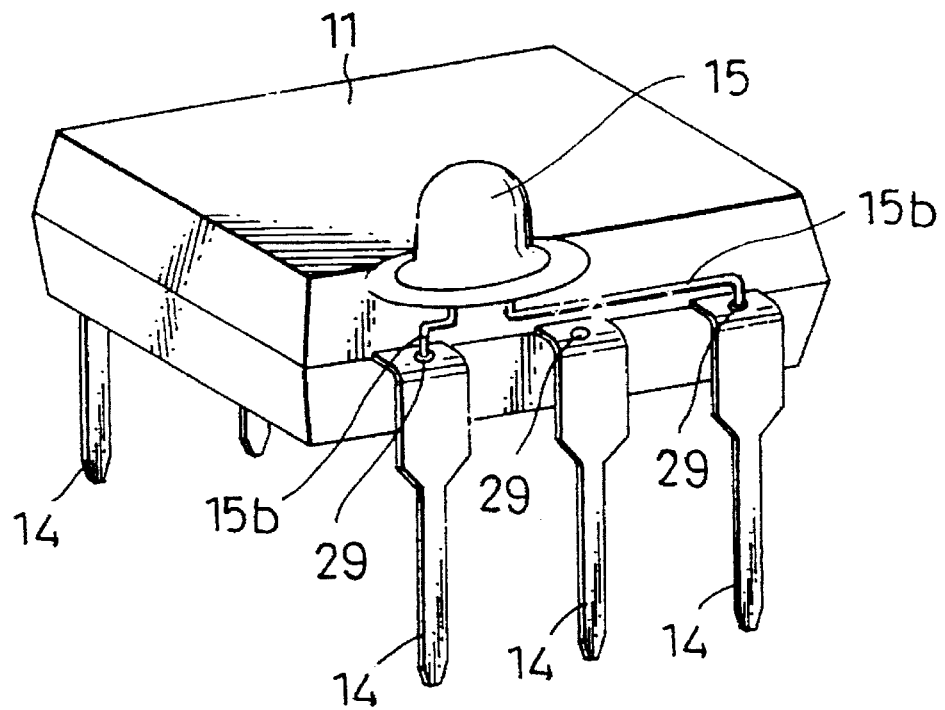
FIG. 40 is a perspective view of Embodiment 11 of the semiconductor switch according to the present invention.

In this Embodiment 11, as shown in FIG. 40, the three lead strips 14 extended from the light emitting side pattern conductors 18 are formed to have soldering connection holes 29 at a position exposed from but close to the package 11, as a lamp connecting means. That is, this Embodiment 11 also adopts a similar arrangement to Embodiment 10, in which the operation displaying lamp 15 is mounted after the formation of the package 11. With this arrangement, the lamp 15 can be mounted to the package 11 after its formation by inserting lead wires 15b of the lamp 15 comprising the visible light emitting diode into the connection holes 29 of the lead strips 14 and soldering them together, and it is possible to simultaneously mount the lamp 15 with the mounting of the semiconductor switch. Other constituents and their functions are the same as those in Embodiment 1.

Embodiment 12

Figure 41:
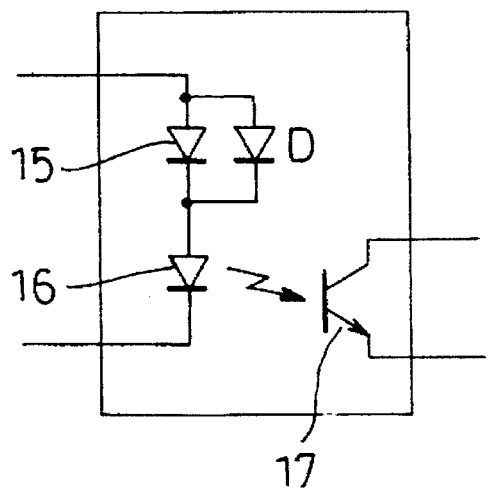
FIG. 41 is a circuit diagram showing an aspect of Embodiment 12 of the semiconductor switch according to the present invention.
Figure 42:
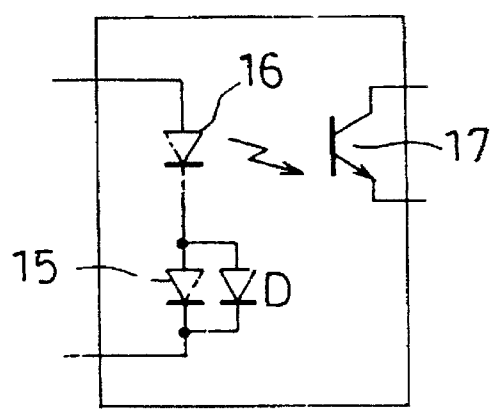
FIG. 42 is a circuit diagram of another aspect of Embodiment 12 of the switch according to the present invention.
Figure 43:
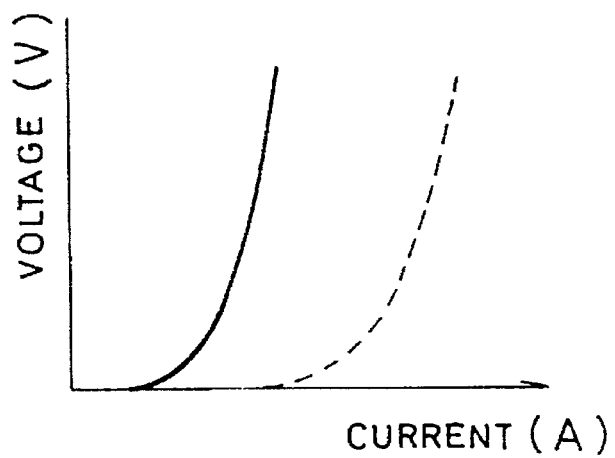
FIG. 43 is a characteristics diagram of the light emitting diode and a diode employed in Embodiment 12 in both aspects of FIGS. 41 and 42.

In the respective foregoing Embodiments, the operation displaying lamp 15 is connected in series to the light emitting element 16, and there may arise a risk that the light emitting element 16 cannot be lighted ON whenever a conduction failure occurs in the lamp 15, and the function of the semiconductor switch cannot be attained. In the present Embodiment 12, on the other hand, a diode D is connected in parallel to the operation displaying lamp 15, as shown in FIGS. 41 and 42, so that a current can be supplied to the light emitting element through this diode D even in the event of the conduction failure occurring in the lamp 15. For the diode D, it is preferable to employ a diode larger in the forward fall voltage than the light emitting diode employed as the operation displaying lamp 15 (in FIG. 43, a solid line curve denotes the current-voltage characteristics of the lamp 15 and a dotted line curve shows the same characteristics of the diode). With this arrangement, the function of the semiconductor switch can be always maintained by the current flowing to the light emitting element 16 through the path of the diode D even upon occurrence of the conduction failure in the lamp 15. It should be appreciated that the present Embodiment 12 is applicable to the respective foregoing embodiments.

Figure 44:
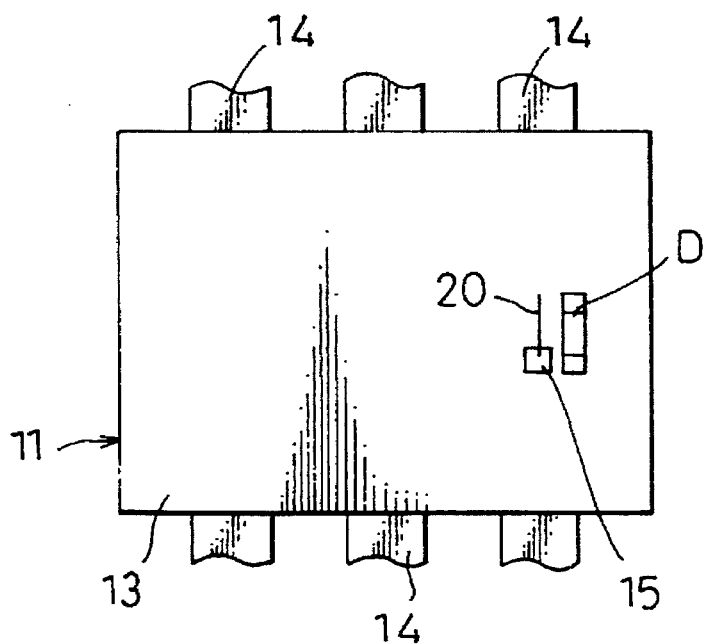
FIG. 44 is a plan view of the switch of Embodiment 12 employing the aspect of FIG. 41.
Figure 45:
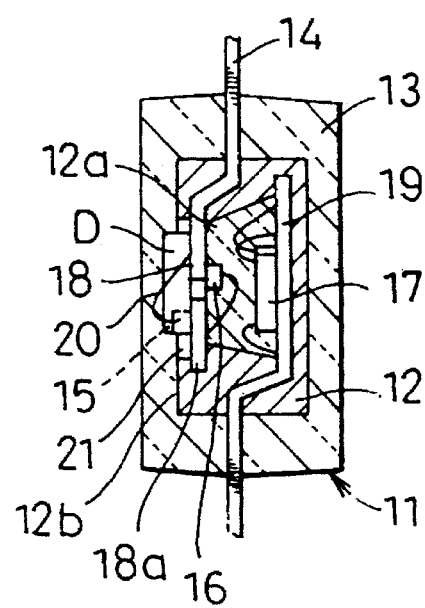
FIG. 45 is a vertically sectioned view of the switch of FIG. 44.
Figure 46:
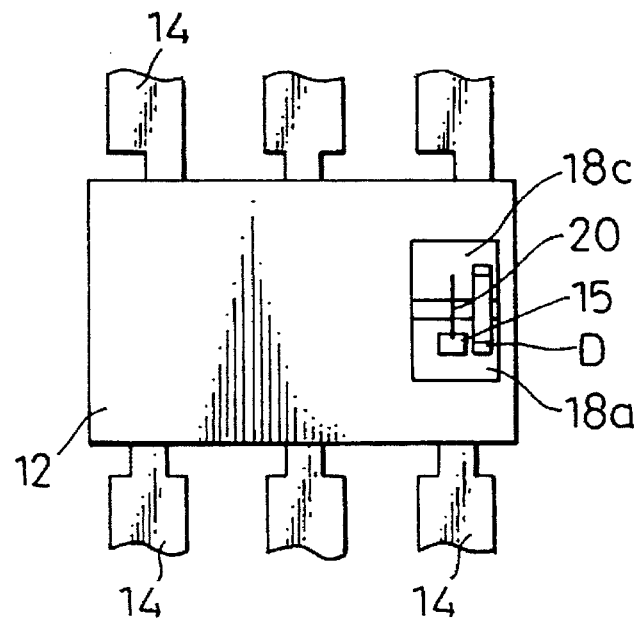
FIG. 46 is a plan view of the switch of Embodiment 12 in a state before formation of the outer molded body.
Figure 47:
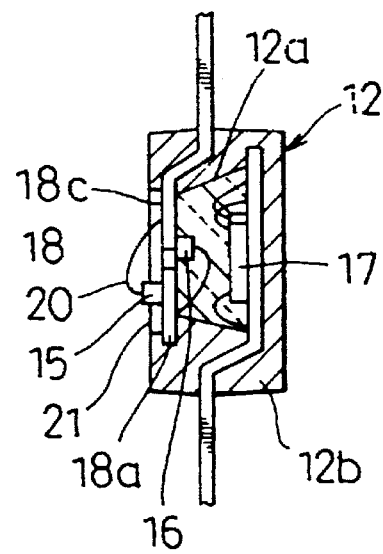
FIG. 47 is a vertically sectioned view of the switch of FIG. 46 before formation of the outer molded body.

As shown in FIGS. 44 and 45, for example, the circuit arrangement of the present Embodiment 12 can be adapted to the structure of Embodiment 4, in which the diode D in the form of a bear chip is disposed along the bear chip of visible light emitting diode forming the operation displaying lamp 15. The diode D has electrodes at both ends, which electrodes are connected to the light emitting side pattern conductors 18 at their exposed portions in the recess 21 for mounting the lamp 15, by means of such electrically conductive adhesive as the solder and silver paste. Other constituents are the same as those in Embodiment 4.

Embodiment 13

Figure 48:
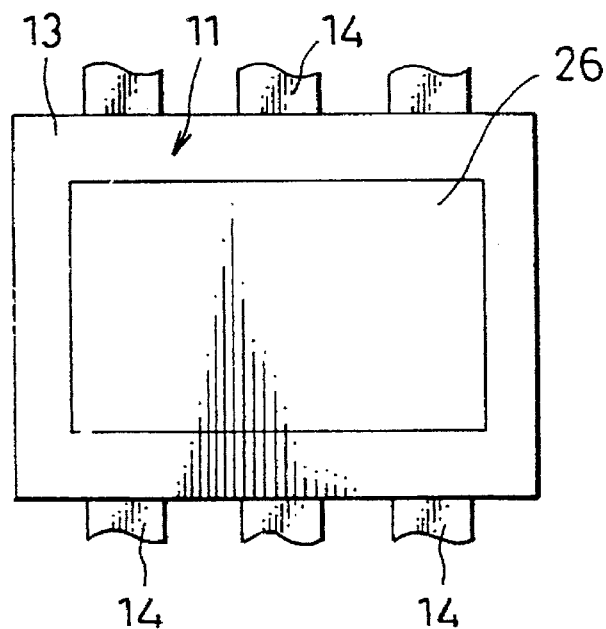
FIG. 48 is a plan view of Embodiment 13 of the semiconductor switch according to the present invention.
Figure 49:
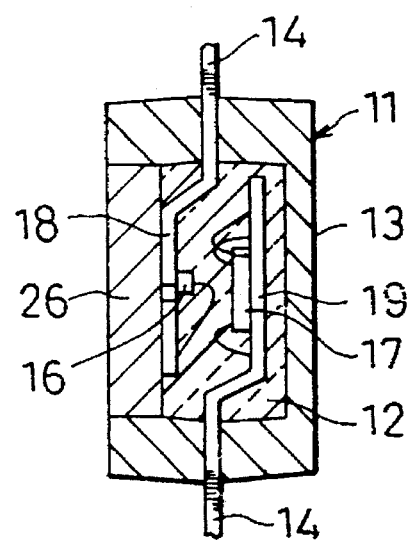
FIG. 49 is a vertically sectioned view of the switch in Embodiment 13 of FIG. 48.

In this Embodiment 13, as shown in FIGS. 48 and 49, a circuit substrate 26 is provided on the package 11, instead of the operation displaying lamp. That is, with the provision of the circuit substrate 26 to the package 11, it is possible to mount on the circuit substrate 26 a driving or controlling circuit for the light emitting element 16 or the light receiving assembly 17. For the circuit substrate 26, a printed-wiring board is employed as integralized with the package 11 with a surface having circuit conductor pattern exposed on one outer side surface of the package 11.

Figure 50:
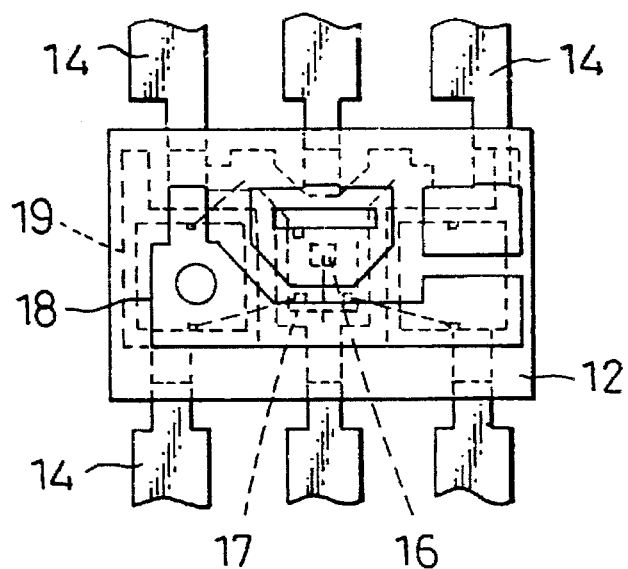
FIG. 50 is a plan view of the switch of FIG. 48 shown with the inner molded body formed with the light emitting side and light receiving side pattern conductors embedded therein.
Figure 51:
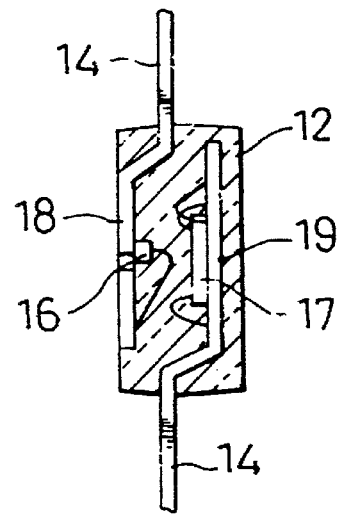
FIG. 51 is a vertically sectioned view of the switch in the state of FIG. 50.
Figure 52:
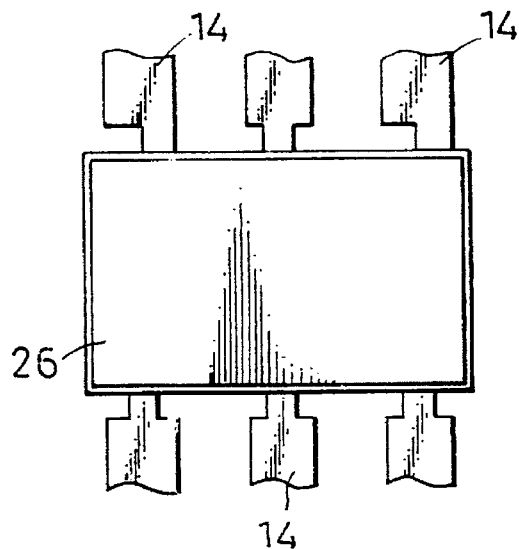
FIG. 52 is a plan view of the semiconductor switch of FIG. 48 in a state before forming the outer molded body.
Figure 53:
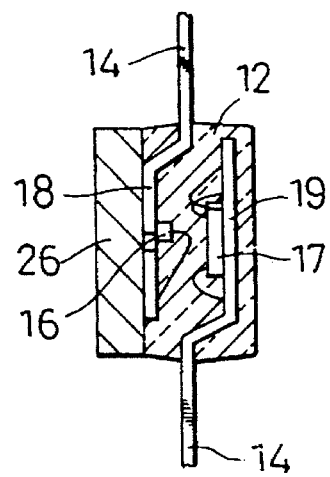
FIG. 53 is a vertically sectioned view of the switch of FIG. 52.

In manufacturing the package of such structure, the inner molded body 12 is formed with the light transmitting synthetic resin as shown in FIGS. 50 and 51, with the light emitting side pattern conductors 18 carrying the light emitted element 16 and the light receiving side pattern conductors 19 carrying the light receiving assembly 17 opposed to each other. At this time, the inner molded body 12 is so formed as to expose the light emitting side pattern conductors on one surface. The circuit substrate 26 is a double-sided substrate and, as shown in FIGS. 52 and 53, connected to the exposed part of the light emitting side pattern conductors 18 out of the inner molded body 12 by means of such electrically conducting adhesive as the silver paste. Here, the circuit substrate 26 is formed to have preliminarily a conductor pattern of a driving circuit for the light emitting element 16, and the conductor patterns on both surfaces of the substrate are electrically connected to each other by means of optimum through holes. Thereafter, the outer molded body 13 is formed with the non-light transmitting synthetic resin, as shown in FIGS. 48 and 49. This outer molded body 13 is so constructed that the conductor pattern on an outer surface of the circuit substrate 26 will be exposed, and the circuit substrate 26 can be held by the outer molded body 13. After forming the package 11, constituent members of the driving circuit are mounted onto the surface of the circuit substrate by means of such conducting adhesive as the solder or silver paste.

While in the above arrangement the driving circuit for the light emitting element 16 is formed on the circuit substrate 26, it is also possible to have the light receiving side pattern conductors 19 exposed out of the inner molded body 12, and to mount a light receiving side treating circuit onto the circuit substrate 26 by connecting the circuit substrate 26 to the light receiving side pattern conductors 19. Further, it is also possible to mount to the circuit substrate 26 a visible light transmitting diode as the operation displaying lamp. Other constituents and functions are the same as those in Embodiment 1.

Embodiment 14

Figure 54:
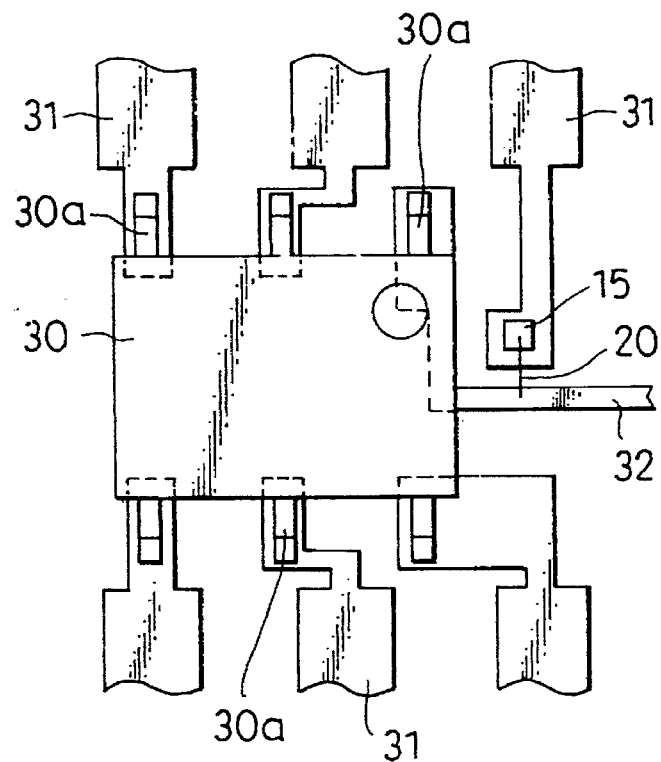
FIG. 54 is a plan view of the semiconductor switch in Embodiment 14 according to the present invention, in a state before forming the outer molded body.
Figure 55:
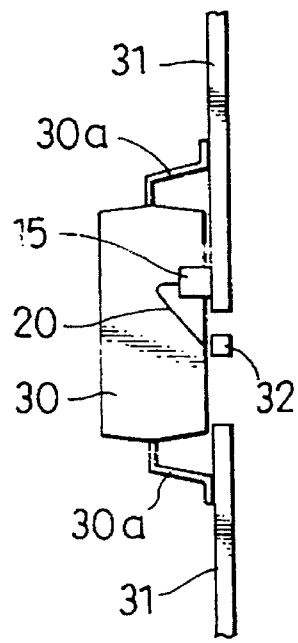
FIG. 55 is a side elevation of the switch in the state of FIG. 54.
Figure 56:
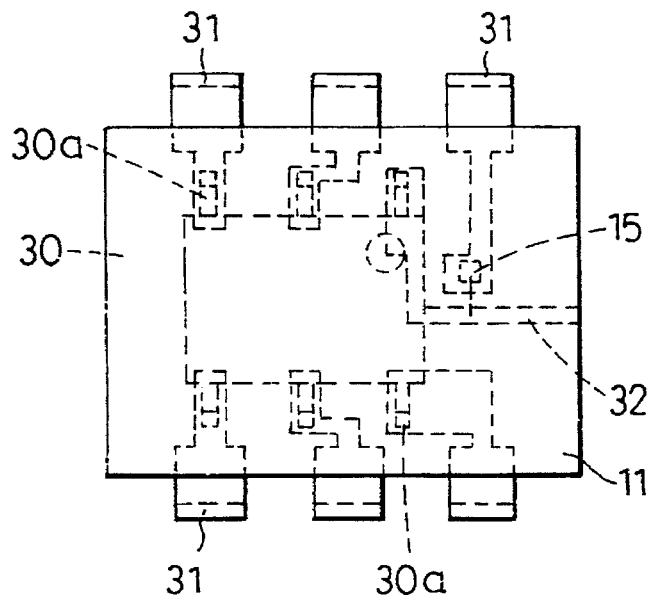
FIG. 56 is a plan view of Embodiment 14 of FIG. 54.
Figure 57:
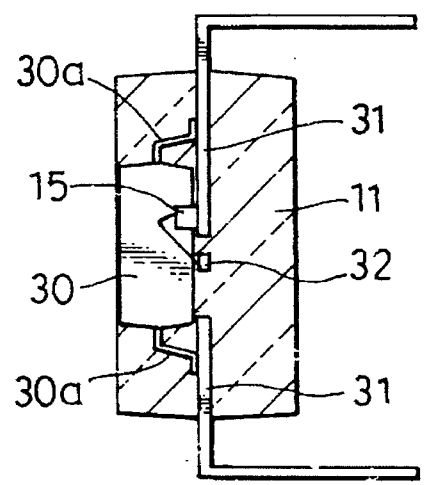
FIG. 57 is a sectioned view of Embodiment 14 of FIG. 54.

While in the respective foregoing Embodiments the light emitting element 16, light receiving assembly 17 and operation displaying lamp 15 are mounted to the light emitting side pattern conductors 18 and light receiving side pattern conductors 19, the present Embodiment 14 employs a ready-made semiconductor switch body 30 provided with a light emitting element and light receiving assembly, as shown in FIGS. 54 and 55. This semiconductor switch body 30 is provided with six terminal strips 30a. The semiconductor switch body 30 is mounted to a lead frame comprising an electrically conducting plate, together with the operation displaying lamp 15 comprising the bear chip, six lead strips 31 in two rows, with three for each row, are formed with respect to the lead frame, and an auxiliary strip 32 independent of the lead strips 31 is provided. This semiconductor switch 30 can be mounted with five of the lead strips 31 and the auxiliary strip 32 employed, and the operation displaying lamp 15 is connected between remaining one of the lead strips 31 and the auxiliary strip 32. Further, as shown in FIGS. 56 and 57, the semiconductor switch body 30 and operation displaying lamp 15 are molded by the package 11 with the light transmitting synthetic resin. As a result, substantially the entire surfaces of the package 11 are caused to emit the light when the lamp 15 is lighted ON.

In manufacturing the semiconductor switch of this Embodiment 14, as shown in FIGS. 54 and 55, the operation displaying lamp 15 comprising the bear chip is mounted through a die bonding process to one of the lead strips 31 in the lead frame having the lead strips 31 and auxiliary strip 32, and it connected to the auxiliary strip 32 by means of a wire bonding process. Further, the semiconductor switch body 30 is mounted to the lead strips 31 and auxiliary strip 32 by means of the silver paste or solder. As shown in FIGS. 56 and 57, further, the entirety is covered with the package 11 made of the light transmitting synthetic resin. Thereafter, the lead strips 31 are cut in a mode partly projecting out of the package 11 for connection with an external circuit, and the auxiliary strip 32 is cut to be flush with the outer surface of the package 11.

With this structure of Embodiment 14, it is enabled to incorporate the ready-made semiconductor switch body 30 and the lamp 15 in the package 11, and thus to treat the semiconductor switch body 30 and operation displaying lamp 15 as a single member. The package 11 is made to emit light in the entirety, upon the turning ON of the lamp 15. Other constituents and functions are the same as those in Embodiment 1.

Embodiment 15

In this Embodiment 15, as shown in FIGS. 58 to 63, a printed wiring board 35 is employed in place of the lead frame, to connect thereto the ready-made semiconductor switch body 30 and operation displaying lamp 15, and lead strips 38 for the connection to the external circuit are provided to the printed wiring board 35. In Embodiment 15, further, the semiconductor switch body 30 employed here is one provided with four terminal strips 30a, and the lamp 15 is connected in series to the light emitting element incorporated in the switch body 30.

Figure 58:
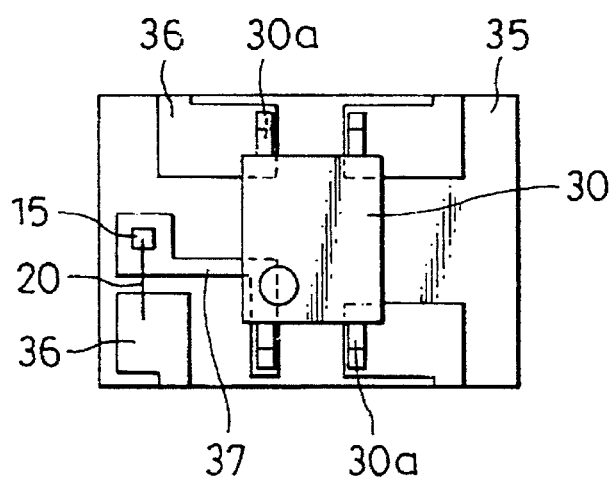
FIG. 58 is a plan view of the semiconductor switch in Embodiment 15, in a state where the switch is mounted on a printed wiring circuit board.
Figure 59:
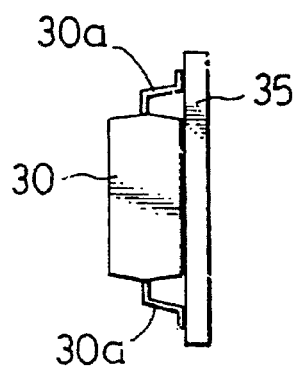
FIG. 59 is a side elevation of the switch in Embodiment 15 as mounted on the printed circuit board of FIG. 58.

In the printed wiring board 35, such four land patterns 36 as shown in FIGS. 58 and 59 are formed, and one auxiliary pattern 37 is formed. The terminal strips 30a of the switch body 30 are connected respectively to each of three of the land patterns 36 and to the auxiliary pattern 37. The lamp 15 is the bear chip, which is connected through the die bonding to the auxiliary pattern 37 and through the wire bonding to the remaining land pattern 36. The board 35 and switch body 30 are molded in the package 11 of the light transmitting synthetic resin. The package 11 may suffice the purpose so long as the same is light-transmitting and may of course be made transparent.

Figure 60:
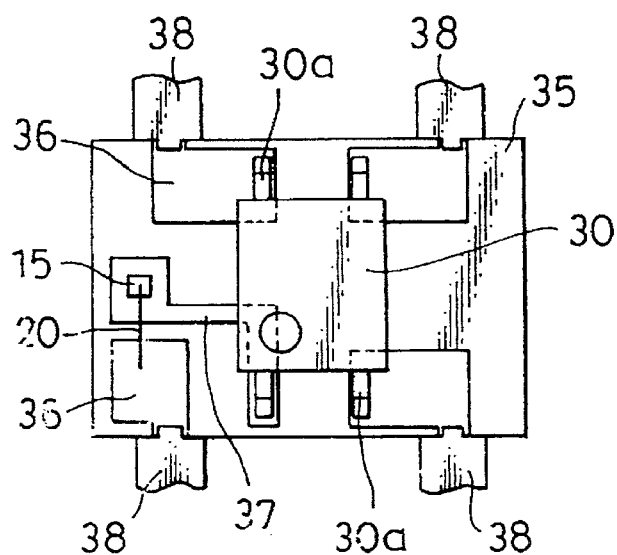
FIG. 60 is a plan view of the switch in Embodiment 15 in a state of before forming the outer molded body.
Figure 61:
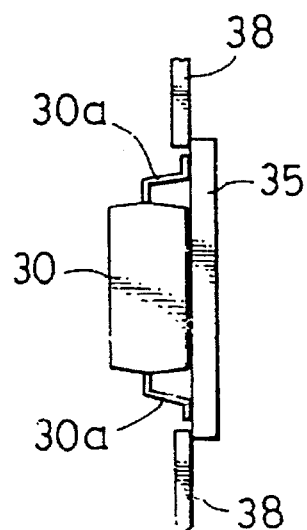
FIG. 61 is a side elevation of the switch in the state of FIG. 60.
Figure 62:
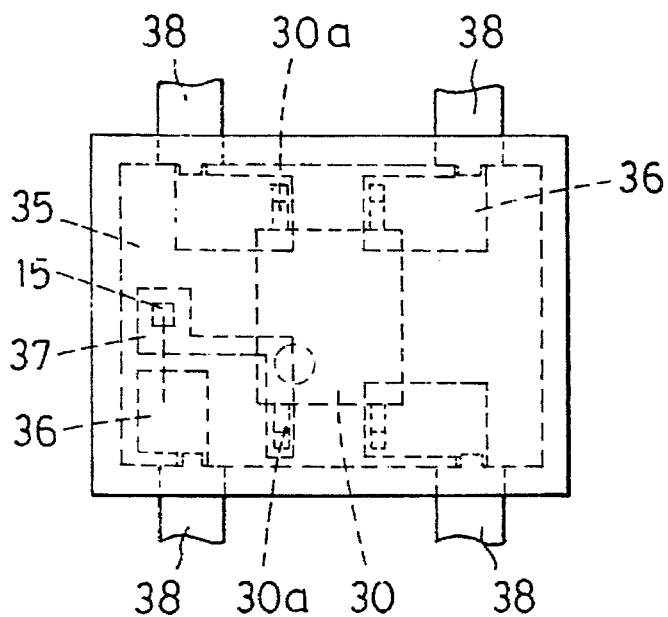
FIG. 62 is a plan view of the switch in Embodiment 15 of FIG. 58.
Figure 63:
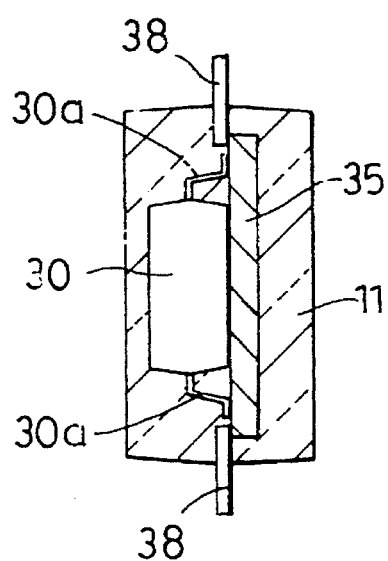
FIG. 63 is a sectioned view of the switch in Embodiment 15 of FIG. 62.

In manufacturing the semiconductor switch of this Embodiment 15, the operation displaying lamp 15 is mounted through the die bonding to the auxiliary pattern 37 on the printed wiring board 35 and, thereafter, to the one land pattern 36 through the wire bonding. The semiconductor switch body 30 is connected to the patterns by means of the silver paste or solder. Then, as shown in FIGS. 60 and 61, the lead strips 38 are mechanically and electrically coupled to the respective land patterns 36 on the board 35 by means of the silver paste or solder. Finally, as shown in FIGS. 62 and 63, the package 11 is mold-formed to cover the switch body 30 and lamp 15. The lead strips 38 are projected out of the side surfaces of the package 11, for the connection to the external circuit.

Since in this Embodiment 15 the operation displaying lamp 15 is mounted on one side surface of the printed wiring board 35, the light from the lamp 15 is almost not incident on other side surfaces of the board 35. Other constituents and functions are the same as those in Embodiment 1.

What is claimed is:

1. An operation displaying semiconductor switch comprising:

light emitting side pattern conductors respectively made of an electrically conducting plate and disposed on one of mutually opposing two planes;

light receiving side pattern conductors respectively made of the electrically conducting plate and disposed on the other one of the mutually opposing two planes;

a light emitting means mounted on the light emitting side pattern conductors;

a light receiving means mounted on the light receiving side pattern conductors;

a package accommodating the light emitting side and light receiving side pattern conductors with the light emitting and light receiving means optically coupled to each other in a mode of being mutually opposed; and means for turning ON and OFF the light receiving means in response to lighting ON and OFF of the light emitting means;

the package including an inner molded body formed of a light transmitting synthetic resin for optically coupling the light emitting means with the light receiving means, the light emitting side pattern conductors and the light receiving side pattern conductors being embedded in the inner molded body, an outer molded body formed of a non-light transmitting synthetic resin and enclosing the inner molded body for blocking incidence of external light onto the inner molded body, the inner molded body including a recess made in one side surface of the body and exposing in the bottom another portion of the light emitting side pattern conductors other than the mounting portion of the light emitting means, and an operation displaying lamp accommodated partly in the recess of the inner molded body as resin-molded therein and electrically connected to the light emitting side pattern conductors exposed at the bottom of the recess, the lamp having a light output surface exposed to a corresponding outer side surface of the outer molded body for providing an output of a visible light upon lighting ON of the lamp.

2. The switch according to claim 1 wherein the operation displaying lamp has an optical guide optically coupled to the light output surface of the lamp and projected out of the outer surface of the outer molded body.

3. The switch according to claim 1 wherein the operation displaying lamp is a light emitting diode, to which a diode higher in forward falling voltage than the light emitting diode is connected in parallel.

4. An operation displaying semiconductor switch comprising:

light emitting side pattern conductors respectively made of an electrically conducting plate and disposed on one of mutually opposing two planes;

light receiving side pattern conductors respectively made of the electrically conducting plate and disposed on the other one of the mutually opposing two planes;

a light emitting means mounted on the light emitting side pattern conductors;

a light receiving means mounted on the light receiving side pattern conductors;

a package accommodating the light emitting side and light receiving side pattern conductors with the light emitting and light receiving means optically coupled to each other in a mode of being mutually opposed; and means for turning ON and OFF the light receiving means in response to lighting ON and OFF of the light emitting means;

the package including an inner molded body in which the light emitting side and light receiving side pattern conductors are embedded, and an outer molded body enclosing the inner molded body, the inner molded body having a recess made in an outer side surface of the body to expose in the bottom surface another portion of the light emitting side pattern conductors other than the mounting portion of the light emitting means, and an operation displaying lamp comprising a bare chip and electrically connected to the exposed portion of the light emitting side pattern conductors in the bottom of the recess as mounted therein for providing an output of a visible light upon being lighted ON, and the inner molded body further comprising a light leading part made with a light transmitting synthetic resin for the optical coupling between the light emitting means and the light receiving means, and a light shielding part made with a non-light transmitting synthetic resin and enclosing the light leading part, while the outer molded body is formed with the light transmitting synthetic resin and covering a surface providing the light output of the operation displaying lamp.

5. An operation displaying semiconductor switch comprising:

light emitting side pattern conductors respectively made of an electrically conducting plate and disposed on one of mutually opposing two planes;

light receiving side pattern conductors respectively made of the electrically conducting plate and disposed on the other one of the mutually opposing two planes;

a light emitting means mounted on the light emitting side pattern conductors;

a light receiving means mounted on the light receiving side pattern conductors;

a package accommodating the light emitting side and light receiving side pattern conductors with the light emitting and light receiving means optically coupled to each other in a mode of being mutually opposed; and means for turning ON and OFF the light receiving means in response to lighting ON and OFF of the light emitting means;

the package including an inner molded body made of a light transmitting synthetic resin with the light emitting side and light receiving side pattern conductors embedded therein for the optical coupling between the light emitting means and the light receiving means, and an outer molded body made of a non-light transmitting synthetic resin and enclosing the inner molded body for blocking any incidence of external light onto the inner molded body, and the outer molded body having a recess made in an outer side surface to expose in the bottom another portion of the light emitting side pattern conductors in the inner molded body other than the mounting portion of the light emitting means, and operation displaying lamp comprising a bare chip and disposed in the recess as electrically connected to the exposed portion of the light emitting side pattern conductors at the bottom of the recess for providing an output of visible light upon being lighted ON, and an optical guide of the light transmitting synthetic resin filled in the recess to be optically coupled to the operation displaying lamp for leading the output light of the lamp to the exterior of the outer molded body.

6. The switch according to claim 5 wherein the optical guide is projected out of the outer molded body, a projected portion of which guide having a surface forming part of a spherical surface.

7. An operation displaying semiconductor switch comprising:

light emitting side pattern conductors respectively made of an electrically conducting plate and disposed on one of two mutually opposing planes;

light receiving side pattern conductors respectively made of the electrically conducting plate and disposed on the other of the two opposing planes;

light emitting means mounted on the light emitting side pattern conductors;

light receiving means mounted on the light receiving side pattern conductors;

a package accommodating the light emitting side pattern conductors and light receiving side pattern conductors opposite one another and in optically coupled relationship; and means for turning the light receiving means ON and OFF in response to lighting ON and OFF of the light emitting means;

the package including an inner molded body made of a light transmitting synthetic resin for optically coupling the light emitting means and the light receiving means and exposing at least another portion of the light emitting side pattern conductors other than the mounting portion of the light emitting means to the conductors, an outer molded body made of a non-light transmitting synthetic resin for enclosing the inner molded body together with the light emitting side and light receiving side pattern conductors for blocking any incidence of external light onto the inner molded body, and an operation displaying lamp resin molded and providing an output of a visible light upon being lighted ON as electrically connected to the portion of the light emitting side pattern conductors other than the mounting portion of the light emitting means thereto and exposed at a surface which provides light output to an outer side surface of the outer molded body.

8. An operation displaying semiconductor switch comprising:

light emitting side pattern conductors respectively made of an electrically conducting plate and disposed on one of two mutually opposing planes;

light receiving side pattern conductors respectively made of the electrically conducting plate and disposed on the other of the two opposing planes;

light emitting means mounted on the light emitting side pattern conductors;

light receiving means mounted on the light receiving side pattern conductors;

a package accommodating the light emitting side pattern conductors and light receiving side pattern conductors opposite one another and in optically coupled relationship; and means for turning the light receiving means ON and OFF in response to lighting ON and OFF of the light emitting means;

the package including an inner molded body made of a light transmitting synthetic resin for optically coupling the light emitting means with the light receiving means and exposing at least portions of the light emitting side pattern conductors other than the mounting portion of the light emitting means, and an outer molded body made of a non-light transmitting synthetic resin for enclosing the inner molded body together with the light emitting side and light receiving side pattern conductors to block any incidence of external light onto the inner molded body, the inner molded body including an operation displaying lamp resin-molded in the body as electrically connected to the exposed portions of the light emitting side pattern conductors for providing an output of a visible light, and the outer molded body being provided with a continuous, integral thinned portion of a thickness enough for transmitting the output light of the operation displaying lamp while covering a surface of the lamp providing the output light.

9. An operation displaying semiconductor switch comprising:

light emitting side pattern conductors respectively made of an electrically conducting plate and disposed on one of two mutually opposing planes;

light receiving side pattern conductors respectively made of the electrically conducting plate and disposed on the other of the two opposing planes;

light emitting means mounted on the light emitting side pattern conductors;

light receiving means mounted on the light receiving side pattern conductors;

a package accommodating the light emitting side pattern conductors and light receiving side pattern conductors opposite one another and in optically coupled relationship; and means for turning the light receiving means ON and OFF in response to lighting ON and OFF of the light emitting means;

the package including an inner molded body made of a light transmitting synthetic resin for optically coupling the light emitting means with the light receiving means and exposing at least portions of the light emitting side pattern conductors other than portions thereof where the light emitting means is mounted, and an outer molded body made of a non-light transmitting synthetic resin for enclosing the inner molded body together with the light emitting side and light receiving side pattern conductors to block any incidence of external light onto the inner molded body, wherein an operation displaying lamp resin-molded and providing an output of a visible light upon being lighted ON is electrically connected to the light emitting means on the light emitting side pattern conductors on the side where the light emitting means is mounted, and is made to penetrate through the light emitting side pattern conductors in their thickness direction while a surface providing the light output of the lamp is disposed on the side of the light emitting side pattern conductors other than the side on which the light emitting means is mounted.

10. An operation displaying semiconductor switch comprising:

means for optically coupling between a light emitting means and a light receiving means which are accommodated in a package, the package being provided with a recessed mounting part in an outer side surface thereof for partly exposing lead strips for connecting the light emitting means to an external circuit; and an operation displaying lamp engaged in the recessed mounting part of the package as electrically connected to the lead strips exposed in the recessed mounting part for providing an output of a visible light upon being lighted ON.

11. An operation displaying semiconductor switch comprising:

means for optically coupling between a light emitting means and a light receiving means which are accommodated in a package and turning ON and OFF the light receiving means in response to lighting ON and OFF of the light emitting means, the package including lead strips projected out of the package for connecting the light emitting means to an external circuit, the lead strips forming with part thereof a connection part; and an operation displaying lamp connected to the connection part for providing an output of a visible light upon being lighted ON.

12. An operation displaying semiconductor switch comprising:

light emitting side pattern conductors respectively made of an electrically conducting plate and disposed on one of mutually opposing two planes;

light receiving side pattern conductors respectively made of the electrically conducting plate and disposed on the other one of the mutually opposing two planes;

a light emitting means mounted on the light emitting side pattern conductors;

a light receiving means mounted on the light receiving side pattern conductors;

a package accommodating the light emitting side and light receiving side pattern conductors with the light emitting and light receiving means optically coupled to each other in a mode of mutually being opposed; and means for turning ON and OFF the light receiving means in response to lighting ON and OFF of the light emitting means;

the package including an inner molded body in which the light emitting side and light receiving side pattern conductors are embedded, and an outer molded body enclosing the inner molded body, the inner molded body having a recess made in an outer side surface of the body to expose in the bottom surface another portion of the light emitting side pattern conductors other than the mounting portion of the light emitting means, and an operation displaying lamp accommodated partly in the recess as resin-molded therein and electrically connected to the exposed portion of the light emitting side pattern conductors in the bottom of the recess for providing an output of a visible light upon being lighted ON, and the inner molded body further comprising a light leading part made with a light transmitting synthetic resin for the optical coupling between the light emitting means and the light receiving means, and a light shielding part made with a non-light transmitting synthetic resin and enclosing the light leading part, while the outer molded body is made with the light transmitting synthetic resin.

13. An operation displaying semiconductor switch comprising:

light emitting side pattern conductors respectively made of an electrically conducting plate and disposed on one of two mutually opposing planes;

light receiving side pattern conductors respectively made of the electrically conducting plate and disposed on the other of the two opposing planes;

light emitting means mounted on the light emitting side pattern conductors;

light receiving means mounted on the light receiving side pattern conductors;

a package accommodating the light emitting side pattern conductors and light receiving side pattern conductors opposite one another and in optically coupled relationship; and means for turning the light receiving means ON and OFF in response to lighting ON and OFF of the light emitting means;

the package including
an inner molded body made of a light transmitting synthetic resin for optically coupling between the light emitting and light receiving means and exposing at least one of the surfaces of the light emitting side pattern conductors and of the light receiving side pattern conductors other than the surfaces on which the light emitting means and light receiving means are mounted, a circuit substrate stacked on the exposed one of the surfaces out of the inner molded body of the light emitting side and light receiving side pattern conductors and electrically connected to at least one of the light emitting means and light receiving means, and an outer molded body made of a non-light transmitting synthetic resin and enclosing the inner molded body except for a surface of the circuit substrate on which a conducting pattern is formed, for blocking any incidence of external light onto the inner molded body.

14. An operation displaying semiconductor switch comprising a semiconductor switch body including a light emitting means and a light receiving means molded in a mode of being optically coupled for turning ON and OFF the light receiving means in response to lighting ON and OFF of the light emitting means, an operation displaying lamp electrically connected to the semiconductor switch body for providing an output of a visible light upon being lighted ON, a lead frame comprising an electrically conducting plate to which are connected the semiconductor switch body and operation displaying lamp, and a package made of a light transmitting synthetic resin and covering the semiconductor switch body and operation displaying lamp except for lead strips of the lead frame for connection to an external circuit.

15. An operation displaying semiconductor switch comprising a semiconductor switch body including a light emitting means and a light receiving means molded in a mode of being optically coupled for turning ON and OFF the light receiving means in response to lighting ON and OFF of the light emitting means, an operation displaying lamp electrically connected to the semiconductor switch body for providing an output of a visible light upon being lighted ON, a printed wiring board on which are mounted the semiconductor switch body and operation displaying lamp, lead strips connected to the printed wiring board for connecting the board to an external circuit, and a package made of a light transmitting synthetic resin for covering the semiconductor switch body, operation displaying lamp and printed wiring board except for the lead strips.

* * * * *